US010500770B2

(12) United States Patent
Oliver

(10) Patent No.: US 10,500,770 B2
(45) Date of Patent: Dec. 10, 2019

(54) LED PACKAGING WITH INTEGRATED OPTICS AND METHODS OF MANUFACTURING THE SAME

(75) Inventor: Steven D. Oliver, San Jose, CA (US)

(73) Assignee: SO-SEMI TECHNOLOGIES, LLC, San Jose, CA (US)

( * ) Notice: Subject to any disclaimer, the term of this patent is extended or adjusted under 35 U.S.C. 154(b) by 365 days.

(21) Appl. No.: 13/038,257

(22) Filed: Mar. 1, 2011

(65) Prior Publication Data
US 2011/0215342 A1    Sep. 8, 2011

Related U.S. Application Data

(60) Provisional application No. 61/309,826, filed on Mar. 2, 2010.

(51) Int. Cl.
*H01L 21/70* (2006.01)
*H01L 33/00* (2010.01)
(Continued)

(52) U.S. Cl.
CPC .............. *B29C 43/18* (2013.01); *H01L 24/97* (2013.01); *B29C 33/424* (2013.01);
(Continued)

(58) Field of Classification Search
CPC ..... H01L 33/486; H01L 33/641; H01L 33/60; H01L 33/647; H01L 2224/48091;
(Continued)

(56) References Cited

U.S. PATENT DOCUMENTS 3,924,228 A * 12/1975 Goodrich ................ G09F 9/372
345/48
5,635,115 A * 6/1997 Konishi ................. G02B 3/005
257/E21.502
(Continued)

FOREIGN PATENT DOCUMENTS

EP    2168746    3/2010
EP    2241428    10/2010
(Continued)

OTHER PUBLICATIONS

Sarvar et al., "PCB Glass-Fibre Laminates: Thermal Conductivity Measurements and Their Effect on Simulation", Journal of Electronic Materials, vol. 19, No. 12, 1990, pp. 1345-1350.*
(Continued)

*Primary Examiner* — Mary A Wilczewski
*Assistant Examiner* — Tsz K Chiu
(74) *Attorney, Agent, or Firm* — Knobbe, Martens, Olson & Bear, LLP

(57) ABSTRACT

Methods and structures are provided for wafer-level packaging of light-emitting diodes (LEDs). An array of LED die are mounted on a packaging substrate. The substrate may include an array of patterned metal contacts on a front side. The metal contacts may be in electrical communication with control logic formed in the substrate. The LEDs mounted on the packaging substrate may also be encapsulated individually or in groups and then singulated, or the LEDs mounted on the packaging substrate may be integrated with a micromirror array or an array of lenses.

27 Claims, 13 Drawing Sheets

(51) Int. Cl.
*H01L 21/98* (2006.01)
*H01L 21/02* (2006.01)
*H01L 25/075* (2006.01)
*H01L 21/56* (2006.01)
*B29C 43/18* (2006.01)
*H01L 23/00* (2006.01)
*B29C 33/42* (2006.01)
*B29L 31/00* (2006.01)
*H01L 33/48* (2010.01)
*H01L 33/58* (2010.01)

(52) U.S. Cl.
CPC ... *B29C 2043/181* (2013.01); *B29L 2031/747* (2013.01); *H01L 33/486* (2013.01); *H01L 33/58* (2013.01); *H01L 2224/32225* (2013.01); *H01L 2224/48091* (2013.01); *H01L 2224/48227* (2013.01); *H01L 2224/73265* (2013.01); *H01L 2224/97* (2013.01); *H01L 2924/014* (2013.01); *H01L 2924/01006* (2013.01); *H01L 2924/01013* (2013.01); *H01L 2924/01029* (2013.01); *H01L 2924/01033* (2013.01); *H01L 2924/01075* (2013.01); *H01L 2924/01082* (2013.01); *H01L 2924/01087* (2013.01); *H01L 2924/10253* (2013.01); *H01L 2924/12041* (2013.01); *H01L 2924/12043* (2013.01); *H01L 2924/15311* (2013.01); *H01L 2924/1815* (2013.01); *H01L 2933/005* (2013.01)

(58) Field of Classification Search
CPC . H01L 2224/48247; H01L 2924/00014; H01L 2224/48257; H01L 2924/10253; H01L 2924/00; H01L 24/97; H01L 33/504; H01L 2924/0102; H01L 2224/97; H01L 2924/01013; H01L 2924/01033; H01L 2924/01051; H01L 2924/01058; H01L 2924/01079; H01L 2924/01082; H01L 2933/0041; H01L 2924/01006; H01L 2924/12041
USPC .............. 257/88, 91, 98; 438/29, 30, 65, 69
See application file for complete search history.

(56) References Cited

U.S. PATENT DOCUMENTS

| | | | |
|---|---|---|---|
| 5,990,992 A * | 11/1999 | Hamanaka et al. ............ 349/95 | |
| 6,733,711 B2 * | 5/2004 | Durocher ................ H01L 23/13 257/E23.004 | |
| 6,786,654 B2 | 9/2004 | Kilian | |
| 6,818,464 B2 | 11/2004 | Heschel | |
| 6,832,013 B1 | 12/2004 | Kuhmann et al. | |
| 6,856,717 B2 | 2/2005 | Kilian | |
| 6,949,771 B2 * | 9/2005 | Yoganandan ........ H01L 33/486 257/99 | |
| 6,969,204 B2 | 11/2005 | Kilian | |
| 7,057,274 B2 | 6/2006 | Heschel | |
| 7,109,580 B2 | 9/2006 | Heschel et al. | |
| 7,165,896 B2 | 1/2007 | Hauffe et al. | |
| 7,209,235 B2 | 4/2007 | Blidegn | |
| 7,213,978 B2 | 5/2007 | Kuhmann et al. | |
| 7,253,388 B2 | 8/2007 | Kuhmann et al. | |
| 7,407,306 B2 | 8/2008 | DeMarb et al. | |
| 7,415,180 B2 | 8/2008 | Blidegn | |
| 7,419,853 B2 | 9/2008 | Kuhmann et al. | |
| 7,467,897 B2 | 12/2008 | Hauffe et al. | |
| 7,470,622 B2 | 12/2008 | Shiv | |
| 7,510,892 B2 * | 3/2009 | Lin ........................ H01L 33/486 257/E25.032 |
| 7,528,422 B2 | 5/2009 | Murphy | |
| 7,531,445 B2 | 5/2009 | Shiv | |
| 7,543,999 B2 | 6/2009 | Winter et al. | |
| 7,553,695 B2 | 6/2009 | Shiv et al. | |
| 7,847,302 B2 * | 12/2010 | Basin ..................... H01L 24/97 257/100 |
| 8,514,491 B2 * | 8/2013 | Duparre ............ H01L 27/14621 359/618 |
| 8,552,299 B2 * | 10/2013 | Rogers ................ H01L 21/4867 174/254 |
| 8,865,489 B2 * | 10/2014 | Rogers ................ H01L 25/0753 438/27 |
| 2001/0026011 A1 * | 10/2001 | Roberts ................ B60Q 1/2665 257/678 |
| 2002/0028045 A1 * | 3/2002 | Yoshimura ............... G02B 6/10 385/50 |
| 2002/0154354 A1 * | 10/2002 | Raj et al. ....................... 359/124 | |
| 2003/0207484 A1 * | 11/2003 | Nishikawa ..................... 438/31 | |
| 2004/0218390 A1 * | 11/2004 | Holman et al. .............. 362/245 | |
| 2005/0093116 A1 * | 5/2005 | Palmteer .............. H01L 33/486 257/676 |
| 2005/0136570 A1 | 6/2005 | Suehiro et al. | |
| 2005/0220414 A1 | 10/2005 | Harada et al. | |
| 2006/0087230 A1 | 4/2006 | Ghosh et al. | |
| 2006/0189013 A1 * | 8/2006 | Schardt et al. ................. 438/26 | |
| 2007/0019306 A1 * | 1/2007 | Wu et al. ...................... 359/811 | |
| 2007/0210461 A1 * | 9/2007 | Fay et al. .............. 257/E23.125 | |
| 2007/0215891 A1 | 9/2007 | Dahl et al. | |
| 2008/0001160 A1 * | 1/2008 | Andrews ................. H01L 33/62 257/79 |
| 2008/0111141 A1 * | 5/2008 | Li ........................... H01L 33/54 257/88 |
| 2008/0117619 A1 * | 5/2008 | Pang ......................... F21K 9/00 362/84 |
| 2008/0122345 A1 | 5/2008 | Sakata et al. | |
| 2008/0290435 A1 * | 11/2008 | Oliver et al. ................. 257/432 | |
| 2009/0020770 A1 | 1/2009 | Wang et al. | |
| 2009/0050946 A1 * | 2/2009 | Duparre et al. ............. 257/294 | |
| 2009/0091048 A1 | 4/2009 | Kawakubo | |
| 2010/0181691 A1 | 7/2010 | Yoshida | |
| 2010/0289163 A1 | 11/2010 | Yoshida | |
| 2011/0090570 A1 * | 4/2011 | DeCusatis et al. ........... 359/619 | |

FOREIGN PATENT DOCUMENTS

| | | |
|---|---|---|
| JP | 04226061 | 2/2009 |
| JP | 04226067 | 2/2009 |

OTHER PUBLICATIONS

USPTO, BPAI Final Decision, Ex parte Norcom, Appeal 2010-2675, Feb. 16, 2012.*

"Lumen Maintenance of White LUXEON® Power Light Sources", Phillips Lumileds Lighting Company, Application Brief AB07, Mar. 2006, pp. 1-4.

Korean Intellectual Property Office; Notification of Transmittal of the International Search Report and the Written Opinion of the International Search Authority, or the Declaration / International Search Report / Written Opinion of the International Searching Authority of Related International Application, Application No. PCT/US2011/026753, Filed Mar. 1, 2011; dated Nov. 30, 2011; Daejeon, Republic of Korea.

Taiwan Office Action dated Sep. 5, 2016 (with English translation), issued in Taiwan Patent Application No. 100106900.

* cited by examiner

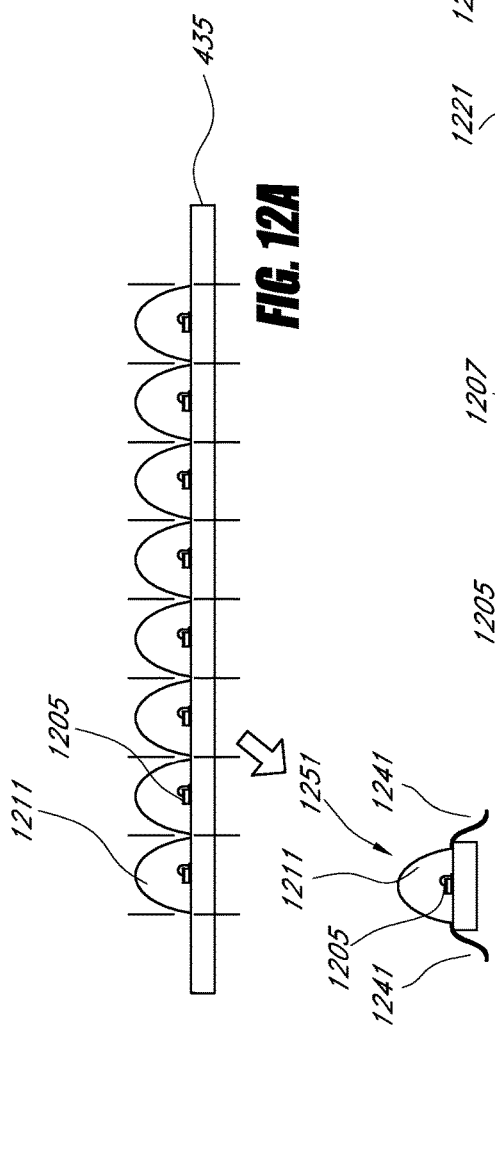
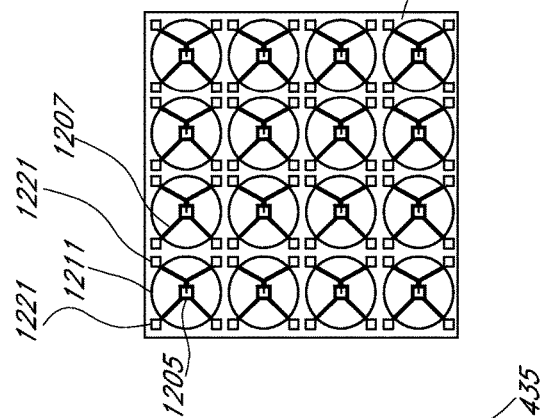
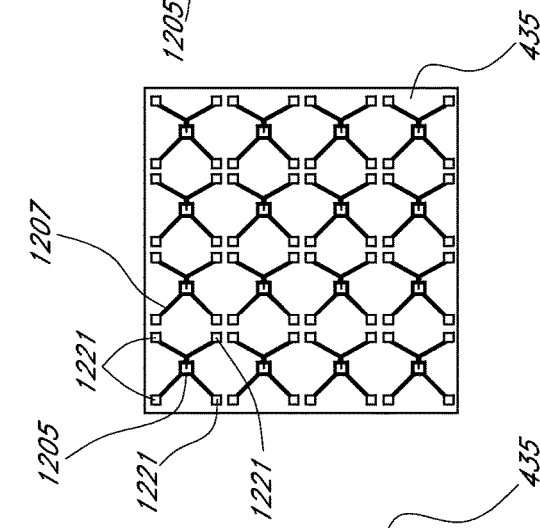
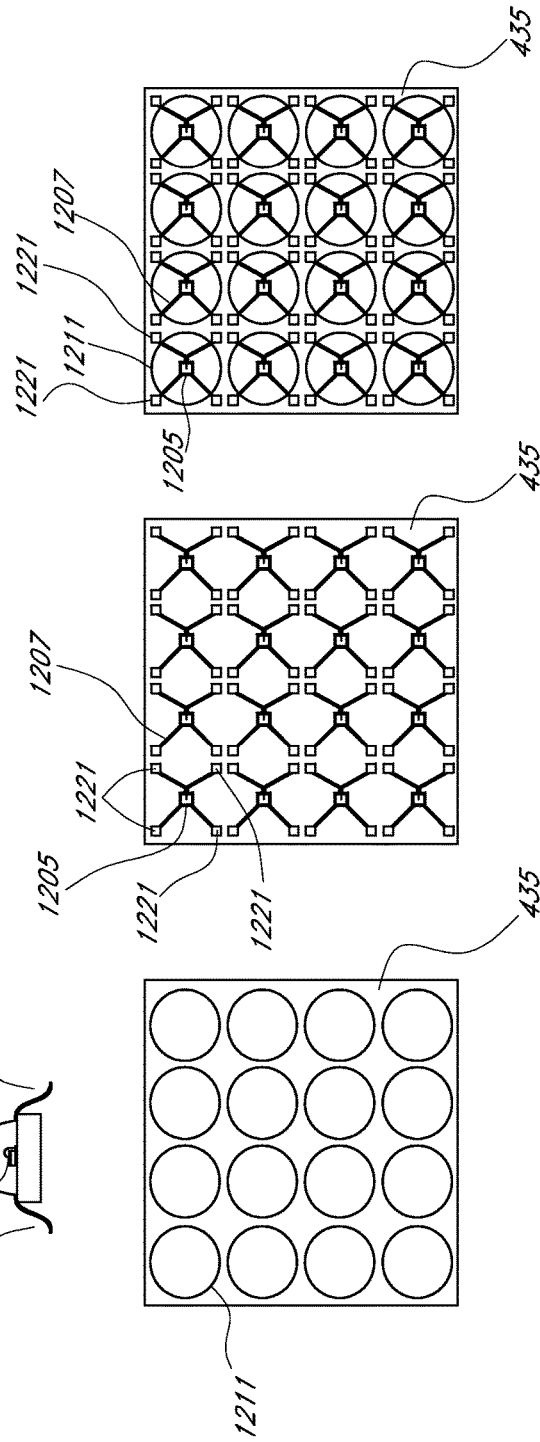

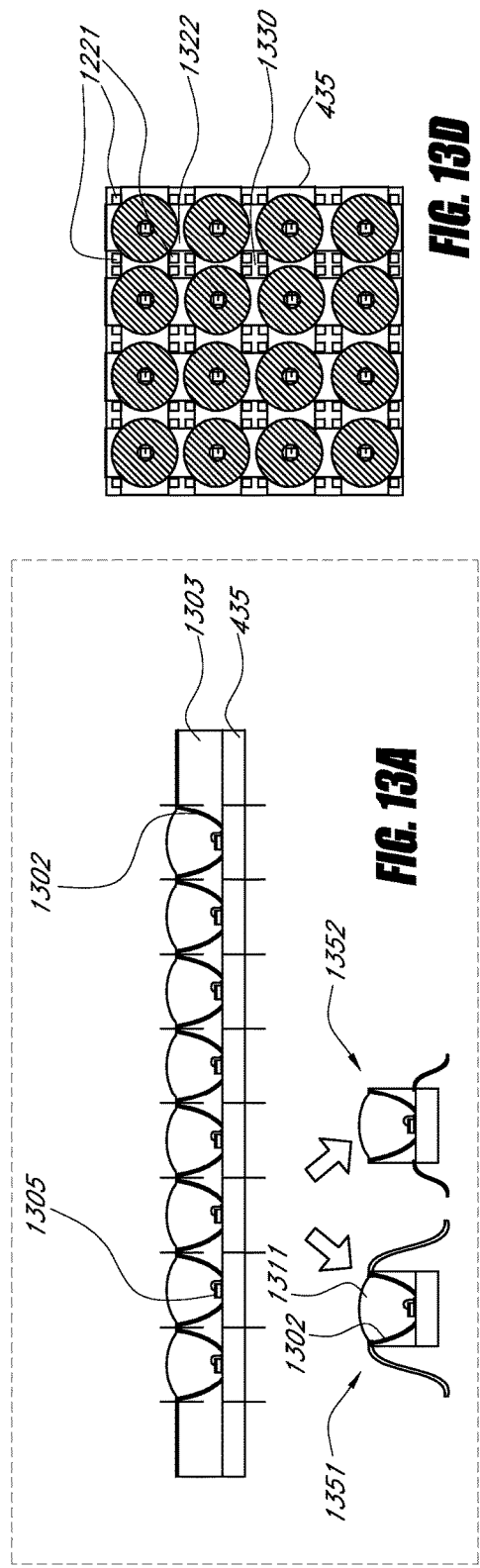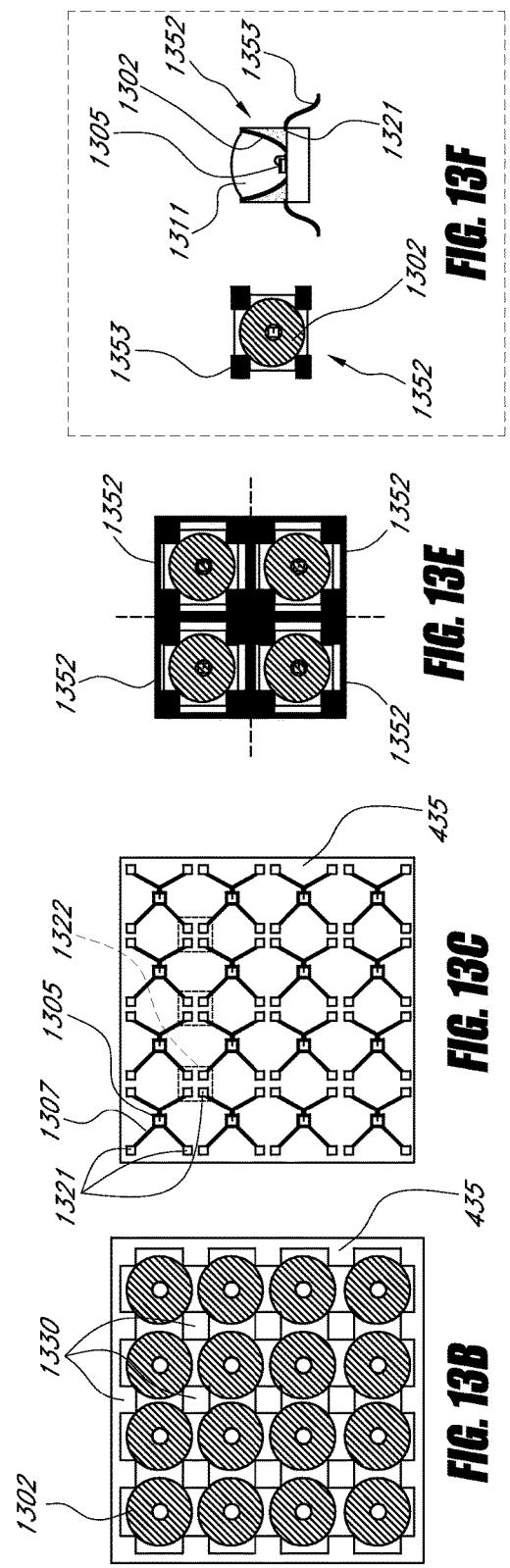

LED PACKAGING WITH INTEGRATED OPTICS AND METHODS OF MANUFACTURING THE SAME

CROSS-REFERENCE TO RELATED APPLICATIONS

This application claims the priority benefit under 35 U.S.C. § 119(e) of U.S. Provisional Application No. 61/309,826, filed Mar. 2, 2010.

FIELD OF THE INVENTION

The invention relates generally to light-emitting diode (LED) devices. In particular, the invention relates to arrays of LEDs integrated with beam shaping optical elements, such as lenses and/or mirrors and methods of manufacturing the same.

DESCRIPTION OF RELATED TECHNOLOGY

Light-emitting diodes (LEDs) are based on the semiconductor diode. When the diode is forward biased (switched on), electrons are able to recombine with holes and energy is released in the form of light. This effect is called electroluminescence and the color of the light is determined by the energy gap of the semiconductor. LEDs present many advantages over traditional light sources including lower energy consumption, longer lifetime, improved robustness, smaller size and faster switching. Applications of LEDs are diverse. For example, they may be used as replacements for traditional light sources in general lighting and automotive lighting. The compact size of LEDs has allowed new text and video displays and sensors to be developed, while their high switching rates are useful in communications technology.

As new applications are continually developed, a growing need exists for more efficient manufacturing and packaging technologies, as well as more efficient end products.

SUMMARY

In one embodiment, a method is provided for simultaneously integrating optical elements on a plurality of light-emitting diodes (LEDs). The LEDs have a front side for emitting light. The method includes dispensing an encapsulation material onto a plurality of LEDs on a packaging substrate. The method also includes simultaneously shaping the encapsulation material over the plurality of LEDs and curing the encapsulation material to form encapsulations in front of the LEDs in the array.

In another embodiment, a method is provided for forming an array of LED die on a packaging substrate. The method includes providing the substrate, wherein the substrate includes an array of patterned metal contacts on a front side. The metal contacts are in electrical communication with control logic formed in the substrate. The method also includes mounting a plurality of pre-fabricated and singulated LED die on the substrate and electrically connecting the LED die with the metal contacts.

In another embodiment, a method for manufacturing LEDs includes mounting a plurality of pre-fabricated and singulated LED die onto a packaging substrate to form an array of substrate-mounted LEDs and laminating an array of molded micro-mirror reflectors onto the array of substrate-mounted LEDs.

In one embodiment, an array of LED die formed on a common packaging substrate includes metal contacts formed on a front side of the common packaging substrate, wherein the metal contacts are electrically connected to leads formed on one of the front side and a back side of the substrate. An array of LED die are mounted on the front side of the substrate, each LED die being in electrical contact with at least one of the metal contacts on the substrate. An array of encapsulations is also included, wherein each encapsulation encapsulates one or more of the LED die mounted on the substrate.

In another embodiment, an array of LED die formed on a common packaging substrate include metal contacts formed on a front side of the common packaging substrate, wherein the metal contacts are electrically connected to leads formed on one of the front side and a back side of the substrate. The array of LED die are mounted on the front side of the substrate, with each LED die being in electrical contact with at least one of the metal contacts on the substrate. A laminated array of micro-mirror reflectors surround the LEDs, wherein each micro-mirror reflector in the array surrounds one or more of the LED die mounted on the substrate and the micro-mirror reflector. In one embodiment, the micro-mirror reflector comprises a smooth curved surface.

In another embodiment, an encapsulated LED having a front side for emitting light comprises an LED mounted onto a packaging substrate, the packaging substrate comprising electrically conductive contacts in electrical connection with the LED and electrical leads electrically connected to the conductive contacts, wherein the conductive contacts are in electrical communication with the electrical leads through electrical traces formed in the substrate. The LED also has a molded encapsulation in front of the LED, the molded encapsulation encapsulating the LED and a portion of the packaging substrate surrounding the LED.

In another embodiment, a method is provided for packaging a plurality of light-emitting diodes. A molding material is dispensed onto a stamping tool. The molding material is stamped and cured to form an array of lenses. The array of lenses is aligned and bonded onto an array of light-emitting diode die mounted onto a packaging substrate.

BRIEF DESCRIPTION OF THE APPENDICES

FIG. 12A is a cross-sectional view of one embodiment of an array of encapsulated LEDs utilizing a leadframe-based packaging and interconnection process.

FIGS. 12B-12D are top plan views showing patterns of encapsulations, underlying traces and a superposition of both patterns proposed for a leadframe-based packaging process.

FIG. 13A is a cross-sectional view of an array of integrated reflector LED packages, also showing two singulated LEDs with alternative lead frame integration.

FIGS. 13B-13D are top plan views showing patterns of reflectors, underlying traces and a superposition of both patterns, also for a leadframe-based interconnection method.

FIG. 13E illustrates a plurality of singulated LED packages with integrated reflectors, mounted on a lead frame prior to lead frame singulation.

FIG. 13F is a plan view and cross section of a singulated LED package with integrated mirror, lens and lead frame.

DETAILED DESCRIPTION OF CERTAIN EMBODIMENTS

LED packages can benefit from optical enhancement, such as from lenses and/or reflectors to guide light from the LEDs in a desired manner. However, packaging LEDs in a manner incorporating such optical elements can be expensive. Additionally, thermal management in LED packaging may be useful because the stability and output of the LED can be limited by the ambient or operating temperature. Particularly for high-power or high-brightness LED, such as an LED consuming more than 1 Watt of power, it is important to provide a good heat sink and to dissipate the heat effectively. Methods and structures described herein may provide bulk packaging techniques for light-emitting diodes (LEDs) that can also provide electrical interconnection and thermal dissipation through the same packaging substrate. Such thermal dissipation may help to keep the LED relatively cool to maintain brightness and extend the operating life of the LED. Independent benefits can be obtained from one or more of performing LED encapsulation/lens application, reflector application and/or electrical connection to leads in bulk at the wafer level.

Figure 1:
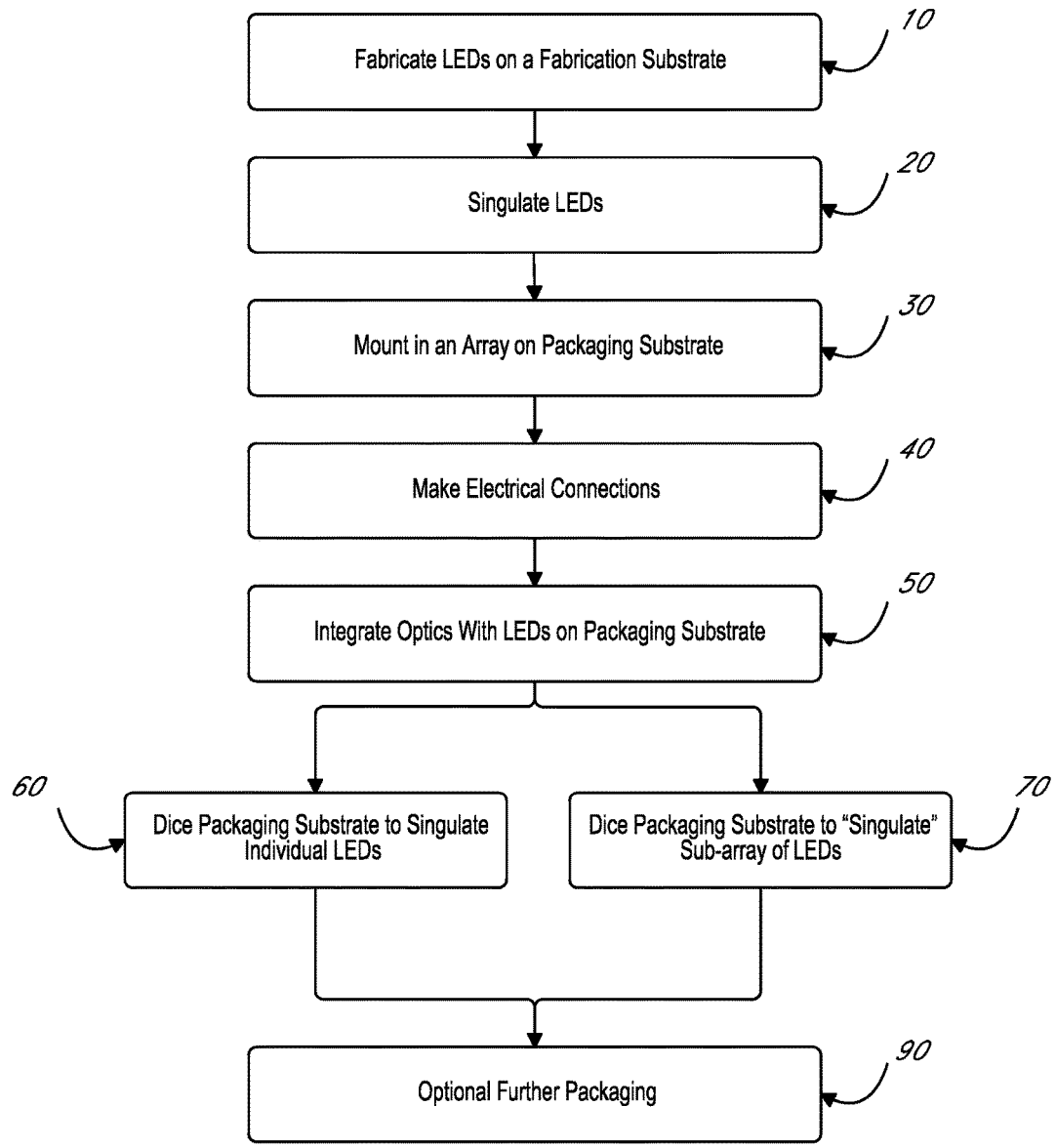
FIG. 1 is a flow chart illustrating methods of manufacturing single LEDs or arrays of LEDs with integrated optics in accordance with embodiments of the inventions.

FIG. 1 is a flow chart illustrating methods for manufacturing LEDs with integrated optics. The LEDs are fabricated 10 on a fabrication (e.g., semiconductor or filled polymer) substrate. The LEDs on the fabrication substrate may be singulated 20 into individual LEDs or smaller arrays depending upon the application.

Subsequently, the singulated LEDs are mounted 30 in an array on a packaging substrate. Spacing of the LEDs will depend upon whether the final product will be a packaged array or individual singulated LED packages, but in any event should be suitable for integration with optical elements (see discussion of step 50 below). Mounting 30 may be done, e.g., using pick-and-place technology or other automated assembly processes.

The packaging substrate may have high thermal conductivity. The packaging substrate may include prefabricated metal leads and other electrical interconnections prior to placement of the LEDs in an array onto the packaging substrate. For example, the packaging substrate may include metal or conductive contact pads on a front surface for electrical connection with the LEDs. The metal or conductive pads may be in electrical communication with leads such as stud bumps or solder bumps on the backside connected by vias, or frontside contacts connected by surface traces. Contact pads can be routed on the front side of the packaging substrate to allow electrical contact such as through wirebonding, thermal sonic bump bonding or solder bump bonding, to a lead frame (see FIGS. 12A-13F) after subsequent singulation. Such vias, traces and contacts can be readily fabricated using known semiconductor or PCB metallization techniques. While the packaging substrate may have high thermal conductivity for high power or high brightness LEDs consuming 1 Watt or more, it is not critical for all LED packaging applications. In one embodiment, the high thermal conductivity of the base packaging substrate combined with the poor electrical conductivity of the base packaging substrate, facilitates the provision of separate metal interconnection from the LED electrodes to the contact pads, and for any more complicated integrated circuitry. Exemplary substrate materials for the aforementioned embodiment, demonstrating high thermal conductivity and low electrical conductivity include semiconductor materials such as Si, BeO, and AlN, for example. Other substrate materials can include thermally conductive ceramic or a molded substrate formed using a curable thermally conductive polymer, for example. Metal substrates are also possible, however, in embodiments with metal or semiconductor substrates, the substrate may be passivated to allow for electrical routing on the substrate to provide electrical contact to LED electrodes on LED die. It will also be understood that not all embodiments use a substrate with high thermal conductivity, depending on the application. For example, in many applications a resin-based bismaleimide-triazine (BT) substrate or glass epoxy FR-4 substrate materials with copper interconnects may have enough thermal conductivity to dissipate the heat adequately. Additionally, a flexible circuit made from Pyralux and/or Kapton polyimide laminates or films—which may be obtained from DuPont Electronic & Communication Technologies in Research Triangle Park, N.C.—may also have enough thermal conductivity to dissipate the heat adequately in certain applications.

In some embodiments, because the packaging substrate can be a semiconductor wafer, the packaging substrate may also be prefabricated to include complex circuitry such as control logic, including CMOS logic. The packaging substrate may also include photodiode circuitry in communication with feedback circuitry to control the LED(s).

After or during mounting 30 the LEDs, electrical connections are made 40 between the LEDs mounted or placed upon the packaging substrate and the contact pads on the substrate. Electrical contact options include wiring bonding, thermosonic bump bonding, solder bumping, anisotropic conductive filler (ACF) technology and/or electrically and/or thermally conducted epoxy or adhesive between the cathode and/or anode of the LED and the substrate's contact pads. Thus, electrical connection 40 may be partially or fully overlap with mounting 30. Once the LED array is formed on the packaging substrate, the resulting substrate may be referred to as an LED-mounted packaging substrate.

While steps 10 to 40 of FIG. 1 show a process of fabricating LEDs on a fabrication substrate and subsequent singulation of the LEDs and mounting onto a packaging substrate, it will be understood that in, some embodiments, the bulk integration of optics or optical elements, as described below may be performed on an array of integrated LEDs on the fabrication substrate, without the need for a separate packaging substrate and the intervening singulation 20.

In step 50, the LED array formed on the packaging substrate is integrated with optics or optical elements. Because a plurality of LEDs can be simultaneously packaged on a wafer substrate, including integration of optical elements and electrical interconnections, the process can be referred to as "wafer level" packaging. Conveniently for use of existing fabrication tools, the packaging substrate can have the dimensions of traditional silicon wafers (e.g., 100 mm, 200 mm, 300 mm and future 450 mm diameter wafers). However, processes and structures described herein and their attendant advantages are not limited to use of wafers. The same concepts can be applied to coupons or rectangular panels of arrayed devices, and the process, whether on a wafer or otherwise, may therefore be referred to generally as "array" packaging.

Figure 2:
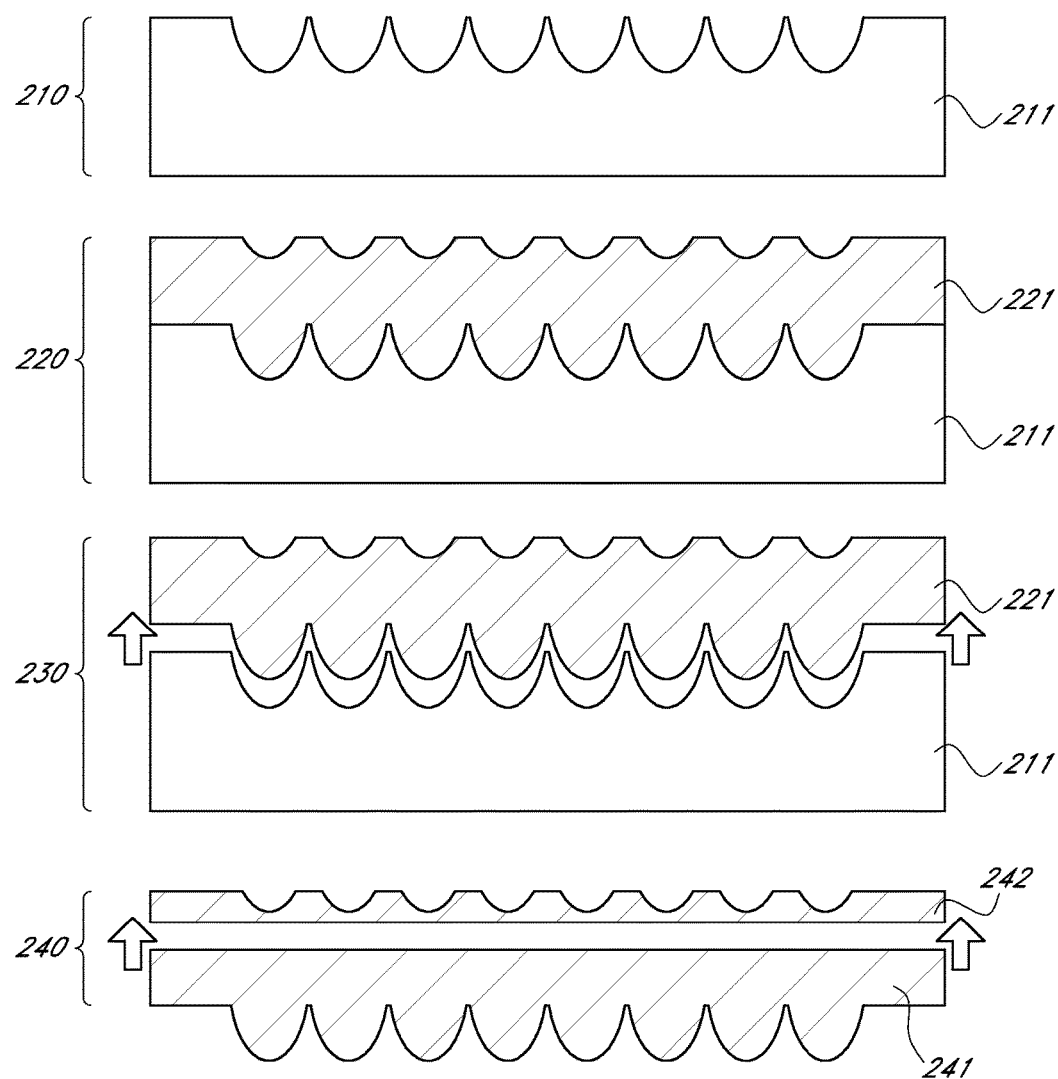
FIG. 2 is a series of schematic cross sections illustrating a sequence for making a stamping tool capable of stamping and molding a molding material to form an array of micro-mirror reflectors, in accordance with one embodiment of the present invention.
Figure 5:
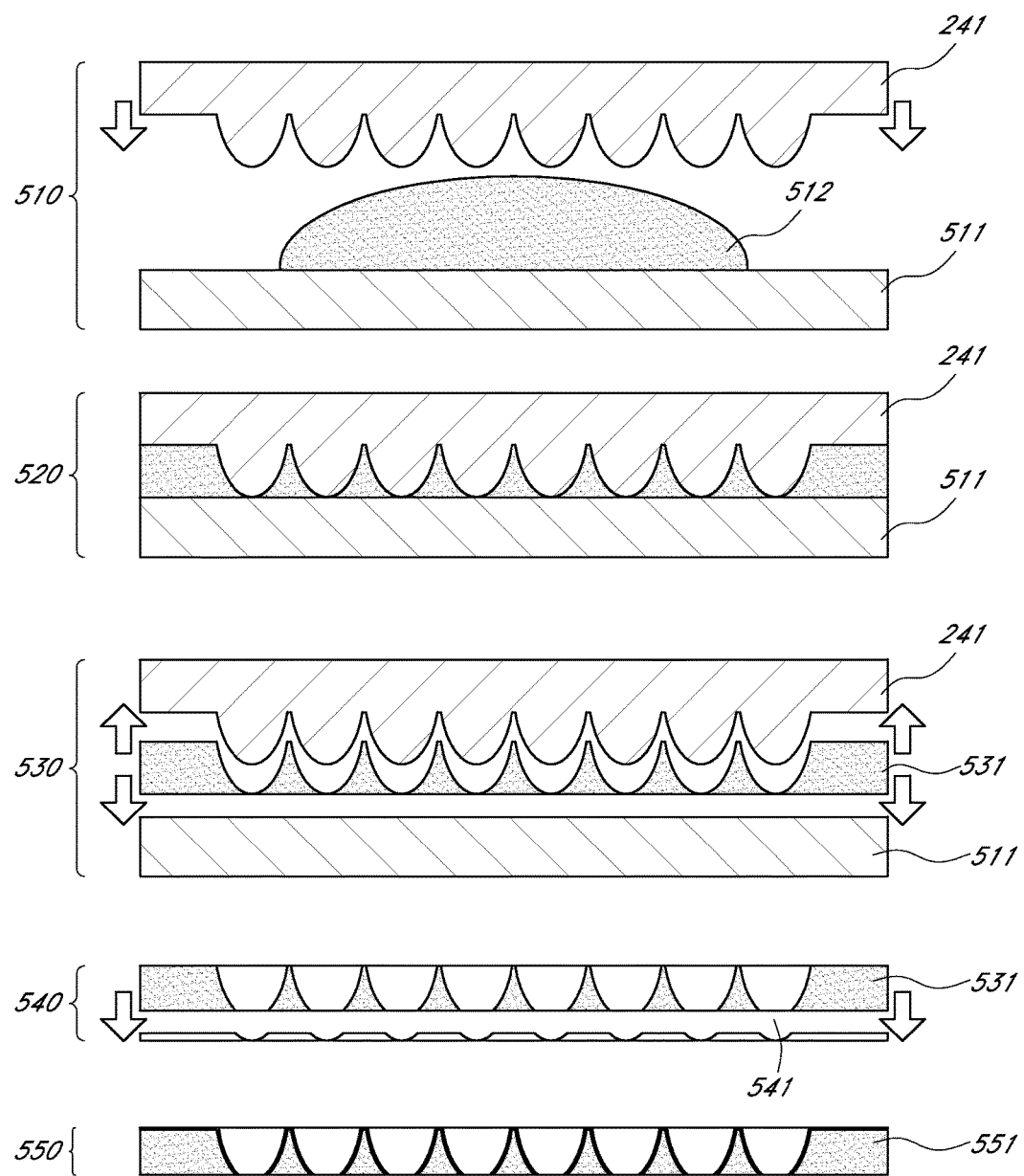
FIG. 5 is a series of schematic cross sections illustrating a sequence for making an array of micro-mirror reflectors using a stamping tool similar to that formed in FIG. 2, in accordance with another embodiment.
Figure 6:
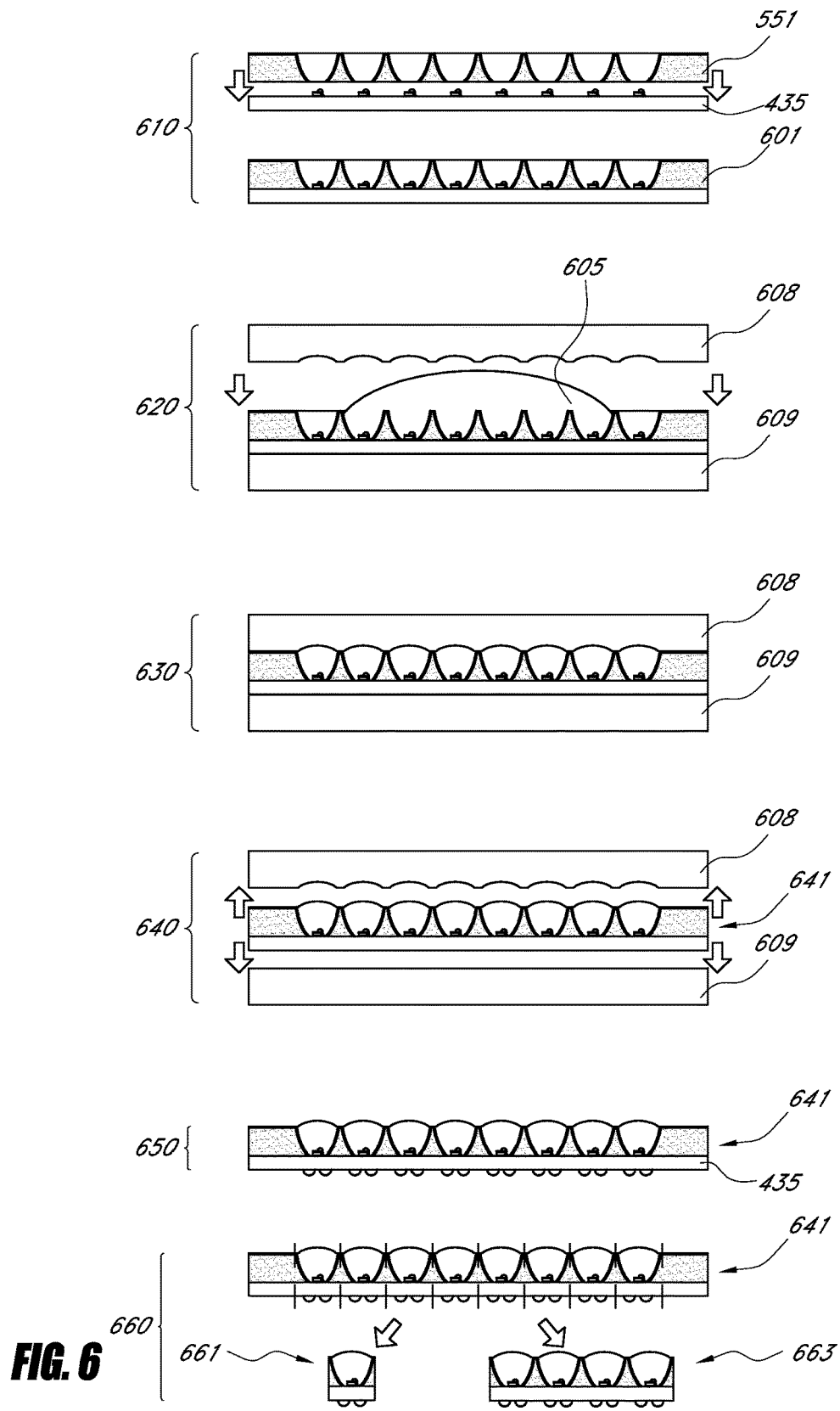
FIG. 6 is a series of schematic cross sections illustrating a sequence for integrating an array of LEDs similar to that of FIG. 4 with a micro-mirror reflector array similar to that of FIG. 5, in accordance with another embodiment.
Figure 7:
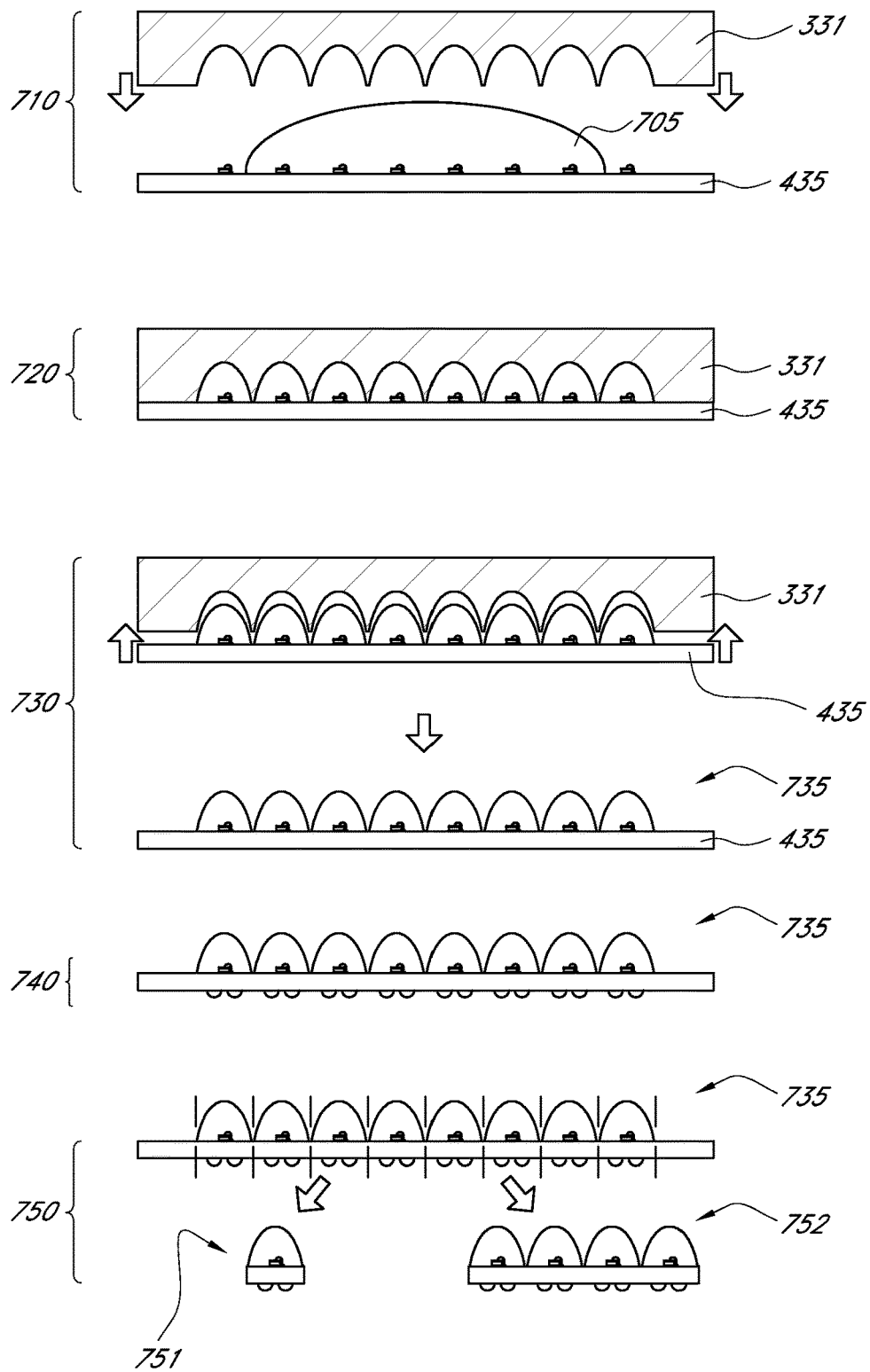
FIG. 7 is a series of schematic cross sections illustrating a sequence for forming and integrating a lens array directly onto an array of LEDs similar to that of FIG. 4 using a stamping tool similar to that of FIG. 3, in accordance with another embodiment.

In one embodiment, as shown in FIG. 6, the array or plurality of LEDs mounted on the packaging substrate is laminated with an array of micro-mirror reflectors. In some embodiments, micro-mirror reflectors may be produced as shown in the steps of FIG. 5. FIG. 5 shows the use of a stamp tool which, in some embodiments, may be manufactured as illustrated in FIG. 2. After lamination, the LEDs may be encapsulated as shown in FIG. 6 or 7. In another embodiment, as illustrated in FIG. 7, the array of LED-mounted on the packaging substrate may be encapsulated without a micro-mirror array, as shown in the steps 710-740 of FIG. 7.

The encapsulation in embodiments with and without micro-mirror reflectors provides the LEDs with lens surfaces on the front sides of the LEDs, i.e., on a light-emitting sides of the packaged LEDs. It will understood, however, that in some embodiments the surface of the encapsulation material in front of the LED may be flat, and may not truly function to focus or diffuse light. In such an embodiment, the encapsulation provides a flat "window" for the LED and is not designed to shape the beam as a lens. This encapsulation material may be concave or convex to provide refractive properties and act as a lens as described herein. In addition, the encapsulation material can also be formulated to contain light scattering particles such that it can act as a diffuser to help randomize the light pattern from the LED. This may be advantageous for certain applications.

In some embodiments, the micro-mirror and/or lens profile desirably shapes the light emissions, e.g., by capturing and re-directing light from all directions and focusing into a more narrow beam, such that they may be referred to as "optical elements." The micro-mirror and/or lens profile may concentrate light from an LED in a front or forward direction. Hence, in step 50, the LEDs mounted in an array onto the packaging substrate are integrated with optical elements simultaneously and as an array. It will be understood, however, that not all LEDs in the array must be integrated with identical optical elements. In other words, in some embodiments, the mirrors in the micro-mirror reflector array 501 may differ from one another. Similarly, the lens profiles of LEDs in the array formed by the stamping tool (shown in FIG. 6 and FIG. 7) may differ from one another.

While the embodiments of FIGS. 6 and 7 illustrate LEDs where each LED is individually encapsulated, in other embodiments, multiple LEDs may be grouped together and encapsulated together and/or surrounded by the micro-mirror reflector housing as a group.

Once the LEDs on the packaging substrate are integrated with optical elements, the packaging substrate may then be diced to form either individual LEDs, or sub-arrays of packaged LEDs. As shown in step 60, the packaging substrate may be diced to singulate individual LEDs. Alternatively, as shown in step 70, the packaging substrate may be diced to singulate a sub-array of multiple LEDs. The final product array of multiple LEDs diced or singulated from the array of LEDs on the packaging substrate may comprise multiple LEDs in one encapsulation or surrounded by a single micro-mirror reflector housing or may comprise a final product array of individually encapsulated LEDs and/or LEDs individually surrounded by micro-mirror reflector housing. In embodiments where a final product array of LEDs is preferable, further packaging may then be done.

FIG. 2 illustrates an embodiment of the fabrication of a stamp tool used for fabricating a micro-mirror array such as the array of micro-mirror reflectors 551 of FIG. 6. In step 210, an array master 211 is fabricated using, for example, a diamond turning process on a metal plate. However, the array master 211 may be formed using one or more of many different manufacturing processes, such as step and repeat, processes of dispensing, molding and curing, or other replication type process. In some embodiments, the entire array master 211 may be simultaneously machined. Alternatively, a step and repeat machining process or a dispense, stamp and molding process may be used to form the array master. For precision machining of optical components, processes and equipment are available, e.g., from Kaleido Technology of Denmark. Step and repeat mastering processes and equipment are provided by Suss Microtech of Germany, EV Group or Austria and AJI Co. Ltd. of Japan.

To form the stamping tool 241, the array master 211 may be replicated using, for example, in one embodiment, a nickel (Ni) electroplating process, as shown in step 220. Alternatively, in another embodiment, the master 211 may be replicated using a soft stamp replication process. This forms an inverse pattern 221 of the array master 211. The Ni electroforming process may involve depositing a seed layer by means of a sputter process and then a thick layer of electroplated nickel is formed. In some embodiments, other metals are used. In another embodiment, replication may include soft stamp replication, in which a liquid polymer such as PDMS (poly dimethyl siloxane) may be dispensed on the array master 211 and then squeezed to the desired thickness before being cured with a UV source. In step 230, the inverse pattern 221 is released from the array master 211. Subsequently, in step 240, the stamping tool 241 is formed by removing the uneven back surface 242 of the inverse pattern 221. This may be done, for example in the case of the metal replicated sub-master, by machining and grinding the back surface of the tool flat. In soft stamp replication, the liquid polymer may be dispensed on a flat plate, and such that backside removal can be avoided. Other methods are also possible. The stamping tool 241 so fabricated can be used to form mirror arrays (see FIG. 5 and attendant description).

Figure 3:
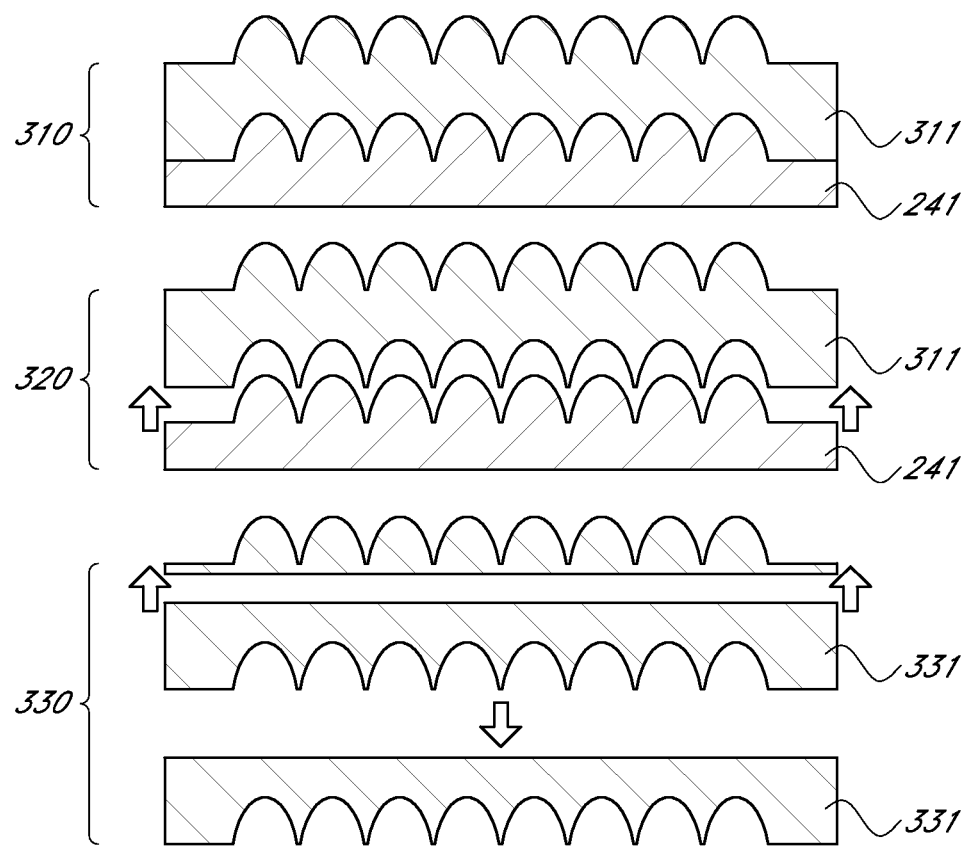
FIG. 3 is a series of schematic cross sections illustrating a sequence for making a stamping tool capable of stamping and molding a molding material to form encapsulation or lens structures, in accordance with another embodiment.

With reference to FIG. 3, alternatively the stamping tool 241 can be used to create an inverse mold or encapsulant stamper 331, which can be used to form lens arrays (see FIGS. 6 and 7 and attendant description).

Referring still to FIG. 3, as shown in step 310, the process for fabricating the encapsulant stamper 331 may begin with the stamping tool 241 fabricated, e.g., by the process of FIG. 2. The stamping tool 241 may be inverted and an electroplated, inverse mold 311 may be formed using techniques similar to those used to form stamping tool 241. As shown in step 320, the inverse mold 311 may then be released from the stamping tool 241. Finally, as shown in step 330, the back surface of the replicated mold 311 may be ground flat or otherwise separated to form the encapsulant stamper 331.

The tools fabricated by the process of FIG. 2 or 3 are useful for the packaging processes described herein. The process may be considered "wafer-level" packaging; however, it is important to note that the packaging wafer or substrate need not be the same substrate as the one on which the LEDs are fabricated. In the illustrated embodiments, LEDs are fabricated and diced from a fabrication substrate (not shown) according to standard LED fabrication techniques and are subsequently mounted on a separate packaging substrate.

Figure 4:
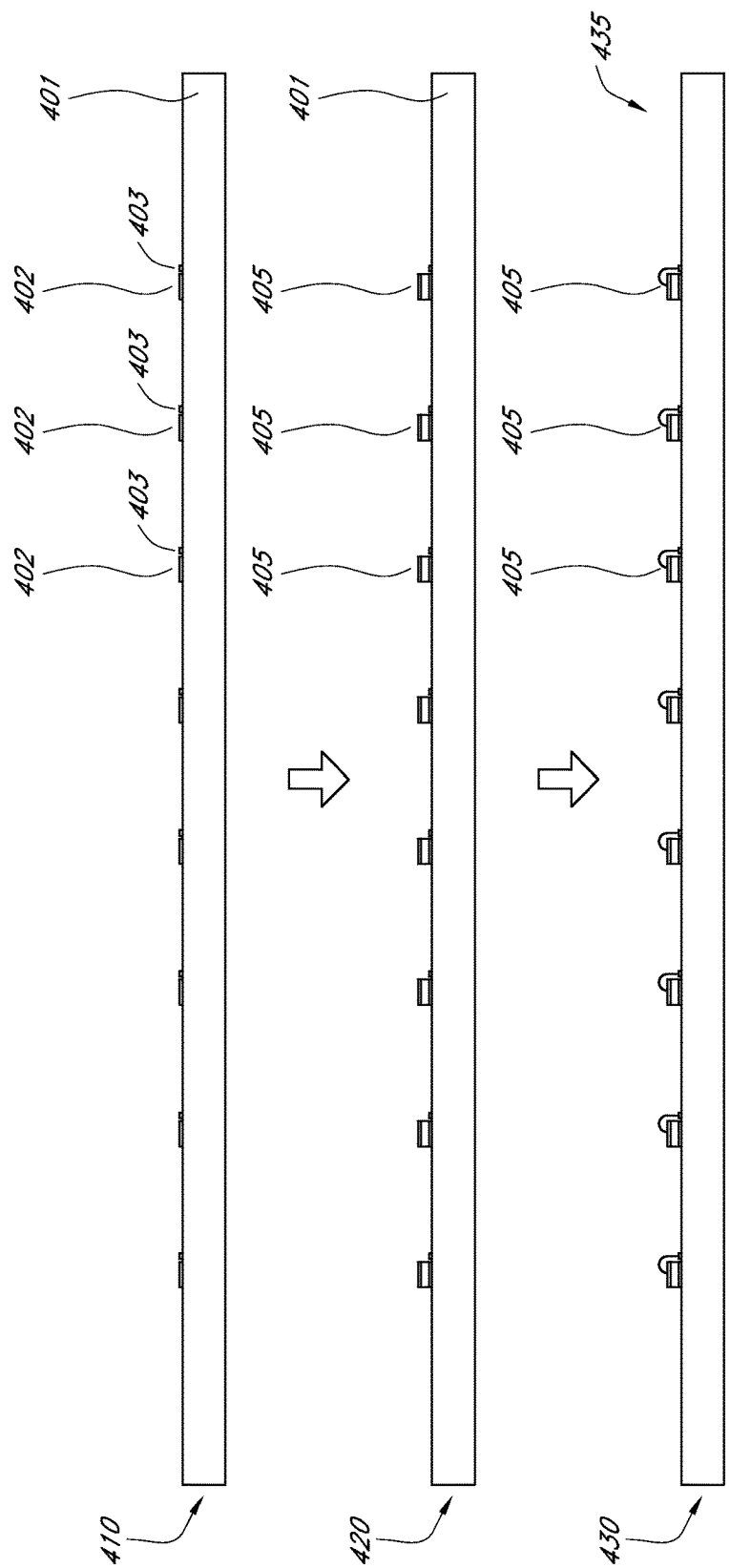
FIG. 4 is a series of schematic cross sections illustrating a sequence for mounting separately manufactured and singulated LEDs to form an array of LEDs on a substrate for the purpose of bulk packaging, in accordance with another embodiment.

With reference now to FIG. 4, as shown in step 410, a packaging substrate 401 may be metallized on a front surface with metal or conductive pads to allow for the subsequent placement of singulated LEDs. Metal or conductive pads may include die pads 402, which can also serve to provide electrical contact with a backside electrode of an LED, and contact pads 403 for electrical contact with a front side electrode of an LED. It should be understood that LED in some cases may have electrical contacts on the same side. In such a configuration, the LED may be flipped and bump contacted to the corresponding pads on the packaging substrate. The packaging substrate 401 may additionally include electrical routing or traces, vias leading to backside contacts or embedded integrated logic circuitry and/or pads for subsequent solder bumping or lead frame connection, etc.

The packaging substrate 401 may also include integrated logic circuitry that will control, provide feedback to, or otherwise interact with the LEDs that are to be placed onto the packaging substrate 401. The logic circuitry may be integrated around the patterned metal contacts or pads 402, 403. The logic circuitry may include, e.g., feedback circuitry integrated with a photodiode. In some embodiments, the packaging substrate is large, e.g. 200 mm, 300 mm, 450 mm, or more. In some embodiments, the packaging substrate is different from the substrate from which the LED die were formed. In some embodiments, the packaging substrate and the substrate from which the LED die were formed may have very different thermal, electrical, and/or mechanical properties. Metallization and any integrated circuitry can be fabricated directly on the packaging substrate 401 or mounted onto the packaging substrate 401 using known semiconductor fabrication techniques. In addition pre-fabricated ICs may also be mounted adjacent to the LEDs on the packaging substrate. These components may be used, for example, for timing, signal conditioning, as well as intensity feedback and control.

As shown in step 420, the packaging substrate 401 is populated with LED die 405. In some embodiments, the pitch of the LED die 405 on the wafer may range from a few hundred microns to several millimeters. For example, the spacing of the LED die 405, from the center of one die to the center of the next, on the wafer may be from about 100 µm to about 1 mm. In embodiments with high power LEDs consuming 1 Watt or more, the spacing may be from about 250 µm to about 2 mm. For low power embodiments, the spacing between LEDs may be from about 25 µm to about 100 µm. The spacing will depend on the type of LED being packaged and the application. In the illustrated embodiment, the backside electrodes of the LED die 405 are connected with the pads 402. The LED die 405 may be connected by soldering, bumping, thermosonic bonding or adhered with electrically and/or thermally conductive epoxy adhesive on the cathode or anode side of the LED 405. One or more LED electrodes can also be wirebonded to the contact pads 403 on the substrate, as shown at step 430. The resultant substrate can be referred to as an LED-mounted packaging substrate 435.

Referring to FIG. 5, the stamping tool 241 formed in FIG. 2 can be used to fabricate an array of micro-mirror reflectors 551. As shown in step 510 of FIG. 5, the stamping tool 241 can be used with a flat stamping plate 511 to stamp and mold a polymer molding material 512. As illustrated in step 520, the material may be cured by a UV and/or thermal process. Although illustrated on the top, it will be understood that the stamping tool 241 may be on the bottom and the stamping plate 511 may be above the stamping tool 241. For example, in some embodiments, the polymer molding material 512 may be dispensed on an inverted stamping tool 241, and the stamping plate 511 may be pressed down onto the stamping tool 241 for curing.

As shown in step 530, the stamping tool 241 and the stamping plate 511 may then be separated to release a molded array 531. An edge trimming process, e.g., using a laser, may be used to clean up the edge of the molded array 531. In some embodiments, it may be desirable for the molded array 531 to be circular in shape for ease of subsequent alignment with a packaging substrate 435, which may also be in wafer form.

As shown in step 540, depending upon the application, it may be desirable to back-grind and planarize the backside of the molded array 531 to form or widen holes 541. The size of opening or hole 541 will depend upon the size of the LED die with which the molded array 531 (soon to become the array of micro-mirror reflectors 551) will be integrated. Hence, in some embodiments, some removal of the mold material from the backside of the molded array 531 may be desirable. Subsequently, as shown in step 550, the molded array 531 is metallized, for example by means of a sputtering or evaporation process, to provide for a reflective surface to form the array of micro-mirror reflectors 551. While the micro-mirror reflectors in the array 551 are illustrated as having smooth, circular or conic-section like shapes, it will be understood that in some embodiments the micro-mirror reflectors in the array 551 may alternatively include faceted, rectangular, or hexagonal shapes depending upon the desired beam shaping property and cost constraints of a particular application.

Referring to FIG. 6, the prefabricated array of micro-mirror reflectors 551 can then be laminated with packaging substrate 435. As shown in step 610, the array of micro-mirror reflectors 551 may be aligned and laminated onto the LED-mounted packaging substrate 435 using a standard wafer bonding process to form an array of LEDs with integrated micro-mirror reflectors 601. Aligning the array of micro-mirror reflectors 551 includes aligning the array of holes 541 formed in the array of micro-mirror reflectors 551 with the array of LEDs of the packaging substrate 435. For example, adhesives can be applied to the bottom of the mirror array 551 or the upper surface of the packaging substrate 435 through a screen printing, ink jet dispense, standard dispense or other such discrete application method. Curing of the adhesive can be by UV or thermal cure.

In step 620, an encapsulation material 605 (e.g., a polymer) may be applied through a dispense process. Many encapsulation materials are known to those of skill in the art, including poly(methyl methacrylate) (PMMA), cyclo olefin polymer resin, composite filled ceramic polymer, and composite ceramic polymers. Other encapsulation materials may also be useful. The material can be applied to each cavity or across the entire mirror array as depicted. Excess material may be controlled through a catch groove at the edge of the substrate. An encapsulant stamper 608 is aligned with the shaped mirrors and LED array and may be structured with a planar stamping surface (not shown) or with a lens profile (as depicted) to help with beam shaping and focusing of the emitted LED light. The encapsulant stamper 608 may be used to simultaneously shape the encapsulation material over the plurality of LEDs. As described previously, the encapsulants can have various shapes or profiles for shaping or focusing the light in an appropriate way, depending upon the application. For example, convex lens profiles may help to focus the light, while concave lens profiles may disperse the light. Diffractive structures may also be possible and the encapsulants may be loaded with scattering materials to provide specific scattering properties to help randomize the light, if desired. The encapsulant stamper 608 may be formed using techniques similar to those described elsewhere herein, for example, the encapsulant stamper 331 of FIG. 3. Step 620 also includes the use of a bottom bonding chuck 609 that may be configured to facilitate the subsequent UV or thermal curing process. In step 630, the LED encapsulation and/or lens material 605 is cured by means of the UV and/or thermal curing process, wherein the chuck 609 and/or the stamper 608 can heat the polymer and/or transmit UV radiation. By curing the encapsulation material, encapsulations are formed over the LEDs mounted on the packaging substrate 435.

In step 640, the encapsulant stamper 608 and the bottom bonding chuck 609 are released and an encapsulated LED wafer 641 with integrated micro-mirror reflectors is removed. The encapsulated LED wafer 641 results from the bonding of the micro-mirror reflectors 551 onto the LED-mounted packaging substrate 435. In some embodiments, as shown in step 650, the backside of the encapsulated LED wafer 641 may be solder bumped. Alternatively, a solder tinning or bumping process may be applied to the backside of the packaging substrate 435, which has integrated conductive paths or vias to the backside. In the case of thermosonic bonding of the LED package, a stud bump may be employed as the backside contact. Subsequently, as shown in step 660, the encapsulated LED wafer 641 may be diced or singulated (e.g., by punching or sawing) into individual encapsulated LEDs 661 each with an integrated micro-mirror reflector. Alternatively, the substrate may be diced to form a smaller array of multiple encapsulated LEDs 663. In some embodiments the encapsulated LED wafer 641 may be left undiced, and may even be assembled with other arrays to form larger LED arrays. While the sub-array of multiple encapsulated LEDs 663 is illustrated with separate encapsulations and micro-mirrors for each LED, it will be understood that in some embodiments multiple LEDs may be encapsulated with a single encapsulation and/or surrounded by a single micro-mirror.

In some embodiments, an array of LEDs with integrated micro-mirror reflectors may be formed by simply bonding a glass plate over an array of LEDs with integrated micro-mirror reflectors, such as the array 601 of step 610. In such an embodiment, instead of applying encapsulation material and stamping with an encapsulant stamper as shown in step 620, a glass plate may be bonded over the top surface of the of micro-mirror reflectors 551. The glass plate may have an inner surface facing the LED and the outer surface opposite the LEDs. In some embodiments with a bonded glass plate, no encapsulation material fills the cavity inside the micro-mirror. Rather, light beam shaping is accomplished by the micro-mirrors. The bonded glass plate may serve to seal and protect the LED.

With reference to FIG. 7, encapsulation without micro-mirrors may be accomplished using techniques similar to those discussed above with reference to FIG. 6. For example, as shown in step 710, an encapsulation material 705 may be applied onto the LED-mounted packaging substrate 435 through a dispense process. The encapsulant stamper 331 is aligned with the LED array and may be structured with a planar upper surface (not shown) or with a lens profile (as depicted) to help with beam shaping and focusing of the emitted LED light. The encapsulant stamper 331 may be formed using techniques similar to those described with respect to FIG. 3 above. It will be understood that, in some embodiments, the encapsulation material 705 may be applied to the encapsulant stamper 331 in the reverse orientation first. In such an embodiment, the LED-mounted packaging substrate 435 may be inverted and brought down upon the encapsulant stamper 331. In either case, as the encapsulant stamper 331 is brought into proximity with the LED-mounted packaging substrate 435, the encapsulation material 705 (which may also be referred to as a "lens polymer") is molded to form a focusing or collimating lens/encapsulation around each LED in the array of LEDs on the packaging substrate 435. Excess encapsulation material 705 may be controlled through a catch groove at the edge of the LED-mounted packaging substrate 435. It may be desirable to perform the stamping/molding of step 710 in a vacuum environment to prevent bubbles.

In step 720, the encapsulation material 705 is cured by means of a UV and/or thermal curing process. By curing the encapsulation material, encapsulations are formed over the LEDs of the packaging substrate 435. After curing, the encapsulant stamper 331 is removed from the LED-mounted packaging substrate 435 as shown in step 730. This releases an encapsulated LED wafer 735. Here, as in the other embodiments where a stamper is released from a cured encapsulation or molding material, it may be desirable to apply a mold release agent or anti-sticking material to the stamper in order to ensure a clean and reliable release process.

In some embodiments, subsequent steps may complete the packaging process. For example, as shown in step 740, backside solder bumping or stud bumping or electroplate bumps may be performed before singulation to allow electrical connection from the back side of the encapsulated LED wafer 735. In some embodiments, this may allow for surface mounting, e.g., mounting to a PCB, after singulation. Also, as shown in step 750, the encapsulated LED wafer 735 may be diced and singulated into an individual encapsulated LED 751 or a smaller array of LEDs 752, depending on the application. In some embodiments, the encapsulated LED wafer 735 is not diced, and may even be assembled with other arrays to form larger arrays of encapsulated LEDs. Also, while sub-array of multiple encapsulated LEDs 752 is illustrated with separate encapsulations for each LED, it will be understood that in some embodiments multiple LEDs may be encapsulated with a single encapsulation.

Figure 8:
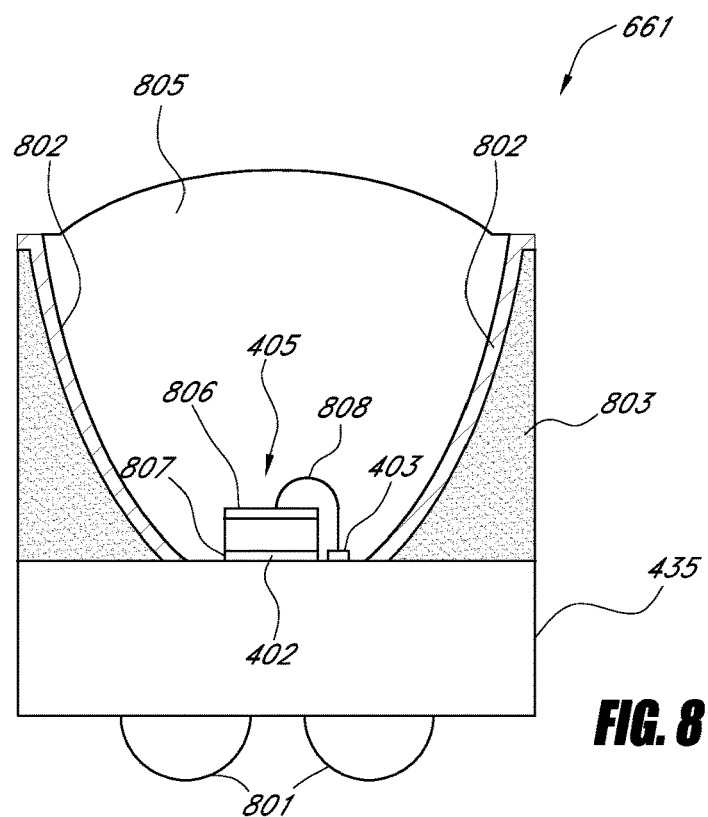
FIG. 8 is a schematic cross section illustrating an array packaged or encapsulated LED with an integrated reflector housing, in accordance with an embodiment.
Figure 9:
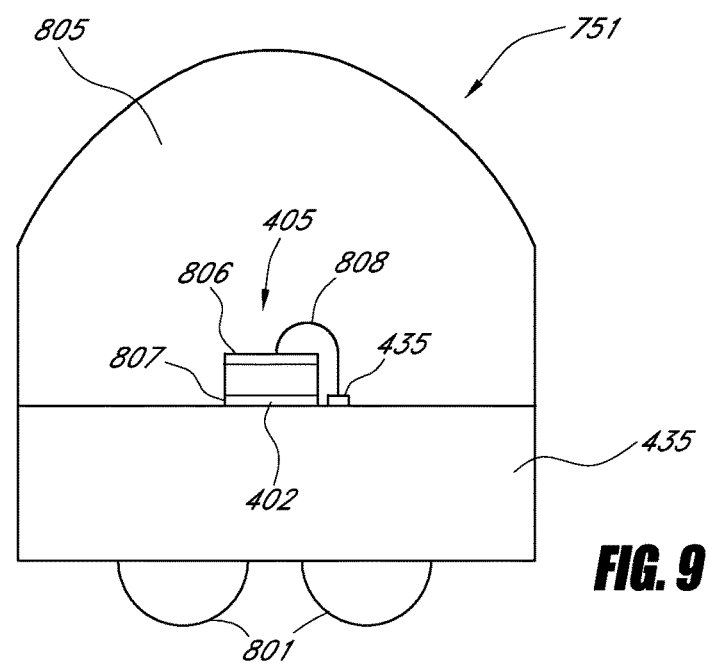
FIG. 9 is a schematic cross section of an array packaged or encapsulated LED with an integrated lens, in accordance with another embodiment.

FIGS. 8 and 9 illustrate two embodiments of individual LEDs integrated with optical elements. FIG. 8 illustrates an embodiment of an individual wafer-level packaged LED 661 with integrated reflector housing of FIG. 6. FIG. 9 illustrates an embodiment of an individual wafer-level packaged LED 751 with integrated lens of FIG. 7. LEDs 651 and 751 may be encapsulated in an encapsulation 805 or lens polymer fabricated in a wafer level process, as illustrated in FIGS. 6 and 7 and described in the corresponding disclosure. The encapsulation 805 may form a lens profile shaped to concentrate light from the LED in the front direction. For example, the molded encapsulation 805 may form a concentrator lens profile in front of the LED. Although any type of LED can be used; in the illustrated embodiments, both types of encapsulated LEDs 651 and 751 include an LED 405 with a topside contact 806 and a bottom side contact 807. The topside contact 806 may be connected via a wirebond 808 to the contact pad 403 on the front side of the packaging substrate 435, while the bottom side contact 807 may be connected via solder or other conducting adhesive to the die pad 402. The skilled artisan will appreciate that, in other arrangements, LEDs can have anode and cathode contacts on one side, which is conducive to flip chip mounting and electrical connection for LEDs with contacts down, or wirebonding both electrodes for LEDs with contacts up.

As noted above, while illustrated with a single LED 405 within one encapsulation in FIGS. 8 and 9, multiple LEDs can be housed within a single package. In some embodiments, the single LED 405 is mounted onto the front of the packaging substrate 435 material, desirably evincing high thermal conductivity and low electrical conductivity, such as Si, BeO, AlN, or thermally conductive polymers. Alternatively, in other embodiments, the packaging substrate 435 material may have low thermal conductivity and may be mounted onto a heat sink. The low thermal conductivity substrate may then be made thin to allow adequate heat flow to the heat sink. The packaging substrate may include metallization (contact pads, traces, via plugs, etc.) for electrical connection to the LED. The contacts may be in electrical communication with stud bumps or solder bumps 801 formed in a front or back side of the packaging substrate 435. It will also be understood that electrical connection may also be accomplished with a lead frame rather than a backside solder bump 801, embodiments for which are described in more detail below with respect to FIGS. 10 and 12A-13F. The packaging substrate 435 may also comprise control logic circuitry for interaction with the LED 405 or for controlling the LED 405. The packaging substrate may also include a photodiode capable of receiving light from the LED 405, where the photodiode is connected to feedback circuitry to provide feedback control of the LED 405.

As illustrated in FIG. 8, in some embodiments, the micro-mirror reflector 802 or micro-mirror reflector housing 803 integrated with the LED 405 comprises a smoothly curved surface to gather and focus light from the LED 405. The reflective coating of the micro-mirror reflector 802 may be formed of a metal with a thickness range of a few microns to 50 microns. Typical reflective coating thicknesses are in the micron range. Thicker coatings can be used if, for example, there is more topography or roughness, in order to get good coverage. In the embodiments disclosed in FIGS. 8 and 9, the encapsulated LED 405 may include an encapsulation having a height of about 2 mm-10 mm. However, the encapsulation and reflector size will depend on the size of the LEDs. The LEDs themselves may typically be approximately 500 micrometers (μm) across, but can range anywhere from 50 μm to several millimeters depending on the application. The height of the LED may typically be 200-300 micrometers; however this can also vary from 20 microns to several millimeters.

Additionally, due to wafer level packaging and dicing, both packages of FIGS. 8 and 9 show packaging material flush with sidewall surfaces of the packaging substrate. For example, the packaged LED 661 of FIG. 8 has a molded polymer reflector housing 803 with sidewalls that are flush with sidewalls of the packaging substrate 435. Similarly, the packaged LED 751 of FIG. 9 has a molded encapsulant 805, a portion of which has sidewalls flush with sidewalls of the package substrate 435. While not all embodiments will include flush polymer 805/803 and substrate 435 sidewalls (see, e.g., FIG. 12D and attendant description), such configuration can be indicative of wafer-level packaging due to the nature of a single dicing process to separate the final packaged devices. In other embodiments, the package may include a glass plate bonded over the micro-mirror reflector 802 and molded polymer reflector housing 803, without any encapsulant.

In the embodiments of FIGS. 6 and 7, the LEDs 405 were mounted onto a packaging substrate 401. In some embodiments, packaging substrate 401 may be shaped and a shaped packaging substrate may be used for mounting LED die and for subsequent wafer-level encapsulation and/or integration with optical elements. Wafer level or multi-array LED packaging where packaging substrates are shaped by molding is illustrated in FIGS. 10 and 11.

Figure 10:
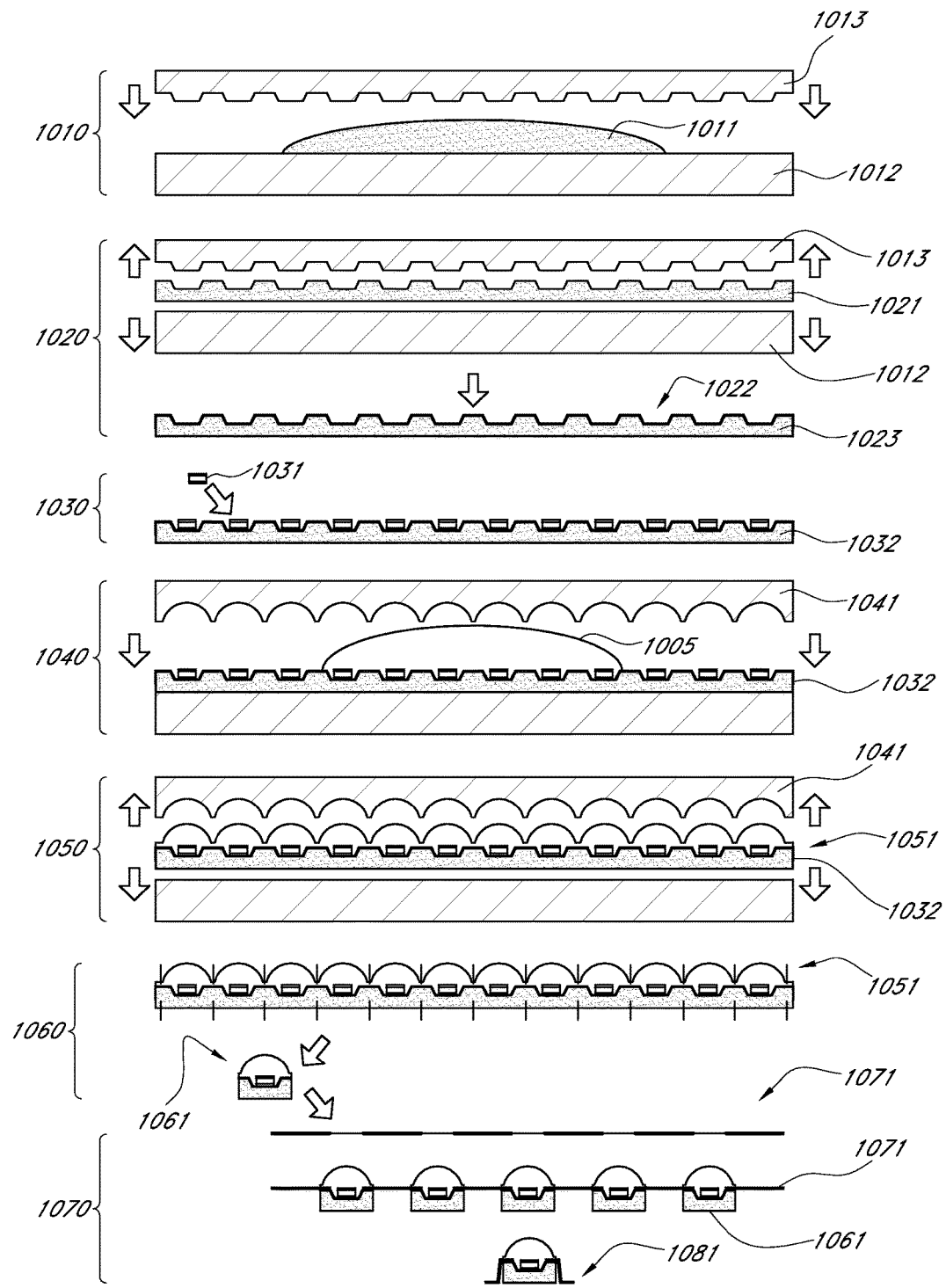
FIG. 10 is a series of schematic cross sections illustrating a process for making a molded substrate for mounting LED die and subsequently mounting and singulating encapsulated LEDs, in accordance with another embodiment.
Figure 11:
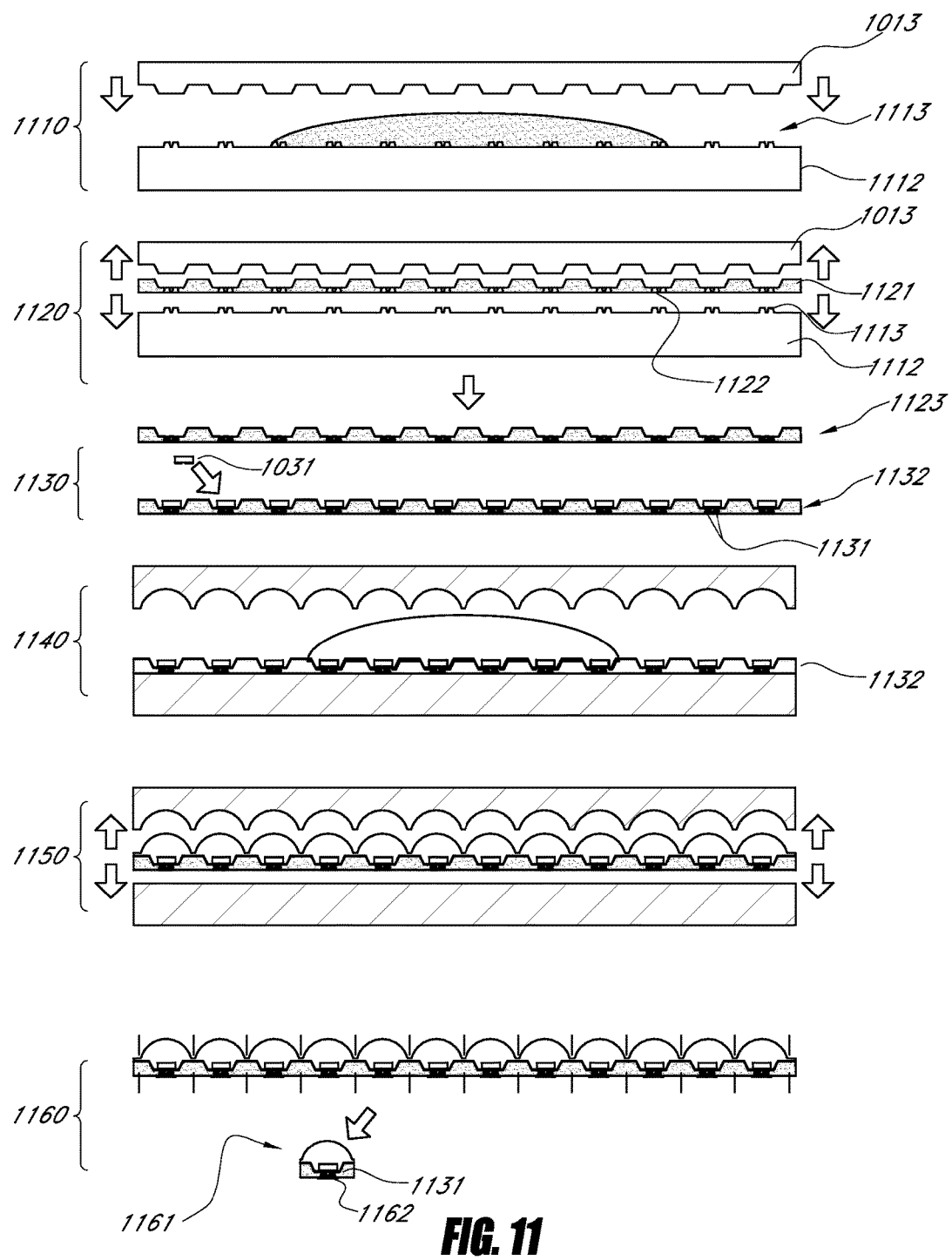
FIG. 11 is a series of schematic cross sections illustrating a process for making a molded substrate with back-side vias for mounting LED die and subsequently mounting and singulating encapsulated LEDs, in accordance with another embodiment.

FIG. 10 illustrates an embodiment of a wafer level LED packaging process using a stamped or molded packaging substrate. As shown in step 1010, first a molding material 1011 is dispensed on a molding chuck 1012. A substrate stamper 1013 may then be brought into proximity of the molding chuck 1012 to mold the molding material 1011 into the desired shape. The substrate stamper 1013 may be formed using techniques similar to those described above in relation to encapsulant stampers 331 or 608. While illustrated showing the molding material 1011 dispensed on the molding chuck 1012, it will be understood that the molding material may alternatively be dispensed on the substrate stamper 1013 in an inverted position and that the molding chuck 1012 may be brought down toward the inverted substrate stamper 1013 in order to mold molding material 1011. As shown in step 1020, after UV and/or thermal curing, the substrate stamper 1013 and molding chuck 1012 may be removed to release a shaped packaging substrate 1021. The shaped packaging substrate 1021 may then be processed to include electrical routing, contact pads for LEDs, contact pads for subsequent solder bumping and/or lead frame connection, etc. as discussed elsewhere herein to produce a metallized, shaped packaging substrate 1023.

The skilled artisan will readily appreciate that filled polymers that are thermally conductive and electrically insulating are commercially available. Suitable examples of moldable materials for fabricating the shaped packaging substrate 1021 include UV or thermally curable resins, including materials filled with micro particles for improved strength and thermal properties.

The wells 1022 formed in the shaped packaging substrate 1023 may be shaped as needed depending upon the application. For example, in some embodiments, the wells 1022 may be shaped to capture and reflect forward by any backwards or sideways emissions from the LEDs. As illustrated, the substrate wells 1022 may have outwardly flared sidewalls, or may be smoothly curved, similar to the reflectors in the array of micro-mirror reflectors 551 of FIG. 5. For embodiments where the wells are shaped for reflection, the shaped packaging substrate 1021 may also be coated with a reflective coating at the same time as metallization of the substrate 1023. In embodiments where the reflective coating is a metal, the packaging substrate 1021 may be coated with a metallic, reflective coating by plating or sputtering the substrate with reflective metal. In such embodiments, the coating is preferably patterned to electrically isolate any electrical contacts and/or wiring integrated in or on the molded packaging substrate 1021 with smooth curvature. Useful methods for patterning metal are known in the art. It will be understood that the subsequent steps may equally be performed using the uncoated shaped packaging substrate 1021 without a reflective coating, and some benefit of redirecting backwards or sideways emissions can be obtained by the polymer of the substrate (even without an added reflective coating).

As discussed with reference to FIG. 4, the shaped packaging substrate 1023 may be populated with LED die 1031, which have been diced from a fabrication substrate, as shown in step 1030. Soldering, thermosonic bonding and/or wirebonding or other techniques may be used to electrically contact the anode and the cathode of the LEDs 1031 with appropriate contact pads on the metallized shaped packaging substrate 1023. After the shaped packaging substrate 1023 is populated with electrically connected LEDs, a resultant LED-mounted shaped packaging substrate 1032 may undergo subsequent encapsulation.

Steps 1040, 1050, and 1060 in FIG. 10 are similar to the steps of FIG. 6. As shown in step 1040 of FIG. 10, an encapsulation material 1005 may be dispensed on the LED-mounted shaped packaging substrate 1032. An encapsulant stamper 1041 is aligned with the LED array. The encapsulant stamper 1041 may be formed using techniques similar to those described in relation to the encapsulant stamper 331 of FIG. 7. It will be understood that, in some embodiments, the encapsulation material 1005 may be applied to the encapsulant stamper 1041 in an inverted orientation. The encapsulant stamper 1041 is brought into proximity to the LED-mounted shaped packaging substrate 1032. The encapsulation material 1005 is cured by means of a UV and/or thermal curing process. By curing the encapsulation material, encapsulations are formed in front of the array or plurality of LEDs in the LED-mounted shaped packaging substrate 1032. After curing, the encapsulant stamper 1041 is removed from the LED-mounted packaging substrate 1032, as shown in step 1050. This releases an array of encapsulated LEDs 1051.

In some embodiments, subsequent packaging steps may be desirable. For example backside solder bumping may be performed to allow electrical connection from the back side of the LEDs in the array. Also, as shown in step 1060, the encapsulated LED wafer 635 may be diced and singulated into an individual encapsulated LED 1061 or a smaller array of LEDs (not shown), depending on the application. As in the embodiment of FIG. 9, some portion of the encapsulant can have sidewalls flush with the packaging substrate. Still other subsequent steps are also possible. For example, individual encapsulated LED 1061 may be populated onto and electrically connected to a lead frame 1071 to form lead contacts for subsequent integration onto other devices and/or PCB, etc., which after punching or saw singulation produces a leaded LED package 1081. It will be understood that prior described embodiments can also employ lead frames in place of solder bumps, and that surface traces can be employed on the packaging substrate in place of interconnection by vias through the substrate.

FIG. 11 illustrates a process using a shaped packaging substrate similar to that shown in FIG. 10. Hence, steps 1110 to 1160 of FIG. 11 correspond with steps 1010 to 1060 of FIG. 10. However, one difference between the embodiment of FIG. 11 and FIG. 10 is that the molding chuck 1112 of FIG. 11 has protrusions 1113 to allow the formation of vias 1122 in the shaped packaging substrate 1121. At steps 1130, the vias 1122 have been filled with conductive plugs 1131 during metallization, producing a metallized shaped packaging substrate 1123. LED die 1031 are mounted and electrically connected to the plugs 1131 to produce an LED-mounted packaging substrate 1132. Steps 1140 and 1150 can be as described for the corresponding steps of FIG. 10. After singulating at step 1160, an encapsulated LED 1161 includes conductive plugs 1131 for electrical connection to the backside of the LED die that is inside the encapsulation. Solder bumps or other appropriate technique may be used to allow for the surface mounting of encapsulated LED 1161 for various applications. The illustrated embodiment shows plated pads 1162 on the underside of the package to facilitate electrical connection, with or without bumps, formed before or after singulation. Singulation can produce individual encapsulated LEDs 1161 or sub-arrays. As in the embodiment of FIG. 9, some portion of the encapsulant can have sidewalls flush with the packaging substrate.

FIGS. 12A to 12D illustrate an embodiment for routing a connection to the anode and cathode of an LED 1205 in an encapsulated LED 1251 to a lead frame 1241. The lead frame 1241 may be connected to electrical contacts that are routed on the surface of the packaging substrate 435. The concepts can also be applied to the metallized shaped packaging substrates 1023/1032 (FIG. 10) and packaging substrates incorporating micro-mirror reflectors (see FIGS. 13A-13E, discussed below) of the previously described embodiments.

FIG. 12B shows positions of encapsulation 1211 on the packaging substrates 435. FIG. 12C shows the positions of the LED die 1205 and electrical routing or traces 1207 on the packaging substrate 435, extending from the LED 1205 (or the die pad, prior to LED mounting) at the center of the package to lead frame contact pads 1221 at the corners of the individual packages. FIG. 12D shows the superposition of the array of encapsulations 1211 over the die 1205, traces 1207 and contact pads 1221 on the LED-mounted packaging substrate 435. As shown, the superposition of the contact pads 1221 may extend outside of the encapsulation 1211. Lead frame leads 1241 may therefore contact the pads 1221 at the corners.

FIGS. 13A-13F illustrate routing and contacts for lead frame connection for LED packages 1351 and 1352 with integrated reflectors 1302 formed in a molded array 1303 similar to the process of FIG. 5. FIG. 13B shows the pattern of the molded array 1303 with its reflective metal coating 1302. FIG. 13C shows the positions of the LED die 1305 (or its die pad prior to LED mounting) and electrical routing or traces 1307 on the packaging substrate 435, the traces 1307 extending from the LED die 1305 at the center of each package to lead frame contact pads 1321 at the corners. As shown in FIG. 13C, the traces 1307 can include metal contacts formed on a front side of the packaging substrate 435. The metal contacts may include separate contacts near the LED die 1305 to provide for electrical contact to the anode and cathode of the LED. For example, one of the anode and cathode may be soldered directly onto one metal contact, while the other of the anode and cathode may be wirebonded to another metal contact. The metal contacts may be electrically connected to contact pads 1321. While illustrated on the front side of the packaging substrate 435, the contact pads 1321 may also be formed on a backside of the substrate, e.g., the contact pads 1321 may be stud or solder bumps. FIG. 13D shows the overlay of the two patterns of FIGS. 13B and 13C.

Gaps 1330 are incorporated in the shaping or molding of the array 1303. The gaps 1330 are positioned and dimensioned to correspond with pad areas 1322 formed in the LED-mounted packaging substrate 435, as shown in FIG. 13C. As shown in FIG. 13D, the pad areas 1322 are left open by the gaps 1330. Hence, when the array 1303 of micromirror reflectors is laminated onto the LED-mounted packaging substrate 435, the contact pads 1331 are left exposed, as shown in FIG. 13D. FIG. 13E shows the array after encapsulating singulation, placement on a lead frame and forming contacts between the contact pads 1321 and leads of the lead frame. The leads may then be cut from the lead frame to release the encapsulated LED 1352 with leads 1353.

While not illustrated in detail, the skilled artisan will appreciate that the integrated reflectors 1302 can be patterned to serve as traces for interconnection for the LED package 1351. Furthermore, while FIGS. 13A-13F illustrate routing and contacts for lead frame connection for LED packages 1351 and 1352 with integrated reflectors 1302, it will be understood that similar routing and contacts may be used with encapsulated LEDs without a micro-mirror array or integrated reflectors. In such an embodiment, the molded encapsulation encapsulating the LED may encapsulate a portion of the packaging substrate surrounding the LED, but may not encapsulate the contact pads 1321 to provide electric leads for connection with a lead frame or other means for providing electric connection to the encapsulated LED.

Figure 14A:
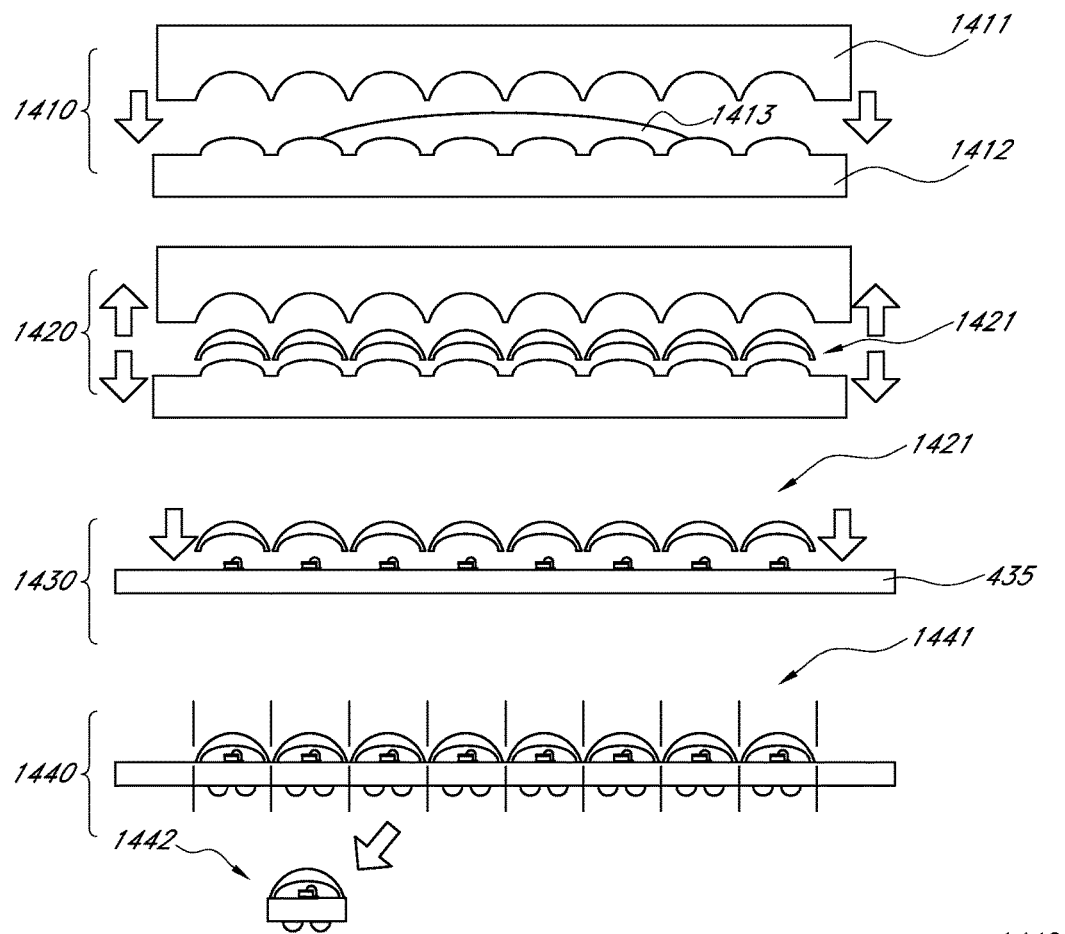
FIG. 14A is a series of schematic cross sections illustrating a process for making a meniscus lens type of lens array and laminating the array onto an LED packaging substrate, in accordance with another embodiment.

FIG. 14A illustrates wafer-level packaging of LEDs with integrated meniscus lenses. The LED packages may be fabricated using methods similar to those discussed elsewhere herein. As shown in step 1410, lens polymer 1413 may be dispensed on a meniscus lens convex stamper 1412 (as illustrated) or on a meniscus lens concave stamper 1411. Masters and copies of the concave outer surface stamper 1411 and the convex inner surface stamper 1412 may be fabricated using techniques similar to those discussed above, and in particular in FIGS. 2 and 3 and the accompanying disclosure. The stampers 1411 and 1412 may then be brought into proximity of each other to mold the lens polymer 1413. As shown in step 1420, the lens polymer 1413 is cured and the stampers 1411 and 1412 are separated to release an array of meniscus lenses 1421. The array of meniscus lenses 1421 may be interconnected to form a laminate or "wafer." Although separated in the particular cross-section shown in FIG. 13A, it will be understood that the lenses in the array 1321 may form a single laminate if individual meniscus lenses remain connected or interconnected by polymer material. As shown in step 1430, the array of meniscus lenses may be aligned and bonded to the LED-mounted packaging substrate 435 using techniques similar to those discussed elsewhere herein. As shown in step 1440, a resultant meniscus lens mounted LED wafer 1441 may undergo singulation of individual LEDs 1442 after having undergone wafer level integration of an integrated meniscus lens 1451 and contact formation, such as forming solder bumps 801 on the backside of the wafer 1441.

Figure 14B:
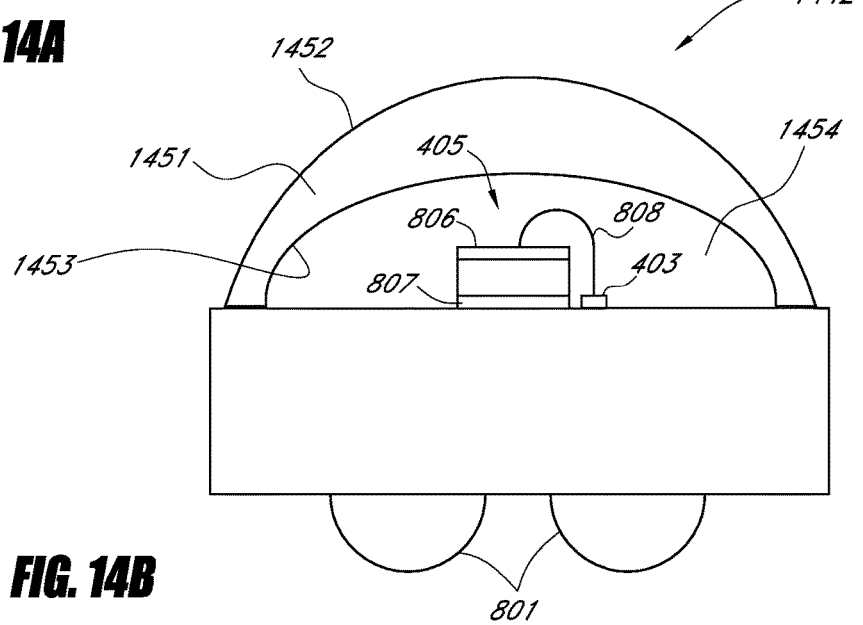
FIG. 14B is a schematic cross section of a singulated LED package with a meniscus lens, in accordance with the embodiment of FIG. 14A.

FIG. 14B illustrates an embodiment of an encapsulated LED 1442 with an integrated meniscus lens 1451. The encapsulated LED 1442 may be integrated with the lens 1451 in a wafer-level process, as illustrated in FIG. 14A. The integrated LED 1442 may include an LED 405 with a topside contact 806 and a bottom side contact 807. The topside contact 806 may be connected via a wirebond wire to a contact pad 403 on the front side of the packaging substrate 435, while the bottom side contact 807 may be connected via solder or other conducting adhesive to a die pad 402. The integrated LED 1442 package may also include solder bumps 801 on the backside, but it will be understood that in other embodiments electrical connection may be accomplished using leads mounted on a front or back side. The meniscus lens 1451 integrated with the LED 405 in the integrated LED 1442 comprises two lensing surfaces, an outer lensing surface 1452 and an inner lensing surface 1453. Advantageously, the outer lensing surface 1452 and the inner lensing surface 1453 may have different curvatures to allow for differing lensing properties as desired. The LED 405 may or may not be additionally encapsulated under the lens 1451, i.e., the inner space 1454 inside the meniscus lens 1351 may comprise a gas (e.g., air) or a vacuum. Alternatively, the inner spacer 1454 may be filled with some liquid or solid material.

While the foregoing detailed description discloses several embodiments of the invention, it should be understood that this disclosure is illustrative only and is not limiting of the invention. It should be appreciated that the specific configurations and operations disclosed can differ from those described above, and that the methods described herein can be used in contexts other than wafer-level packaging of LEDs. The skilled artisan will appreciate that certain features described with respect to one embodiment may also be applicable to other embodiments. For example, various features of the encapsulated LEDs with and without micro-mirror reflectors have been discussed, and such features may be readily applicable to the LED integrated with a meniscus lens, and vice versa. Similarly, various electrical connection schemes (e.g., solder ball through backside connection versus leadframe use and topside contact) described herein can be readily applied to different embodiments with wafer level encapsulation, lensing and/or micro-mirror lamination. Accordingly, the reference should be had to the appended claims for an understanding of the scope of the present invention.

I claim:
1. A method for simultaneously integrating optical elements on a plurality of light-emitting diodes (LEDs), the LEDs having a front side comprising:
   mounting a plurality of LEDs on a packaging substrate;
   after mounting, dispensing an encapsulation material onto the plurality of LEDs on the packaging substrate, the dispensed encapsulation material having a rear surface facing the LEDs and a front surface opposite the rear surface;

simultaneously shaping the front surface of the encapsulation material over the plurality of LEDs;

curing the encapsulation material to form encapsulations in front of the LEDs; and integrally attaching a molded mirror reflector array to the substrate to integrate the LEDs with the molded mirror reflector array prior to dispensing the encapsulation material.

2. The method of claim 1, wherein shaping comprises stamping the encapsulation material with a patterned stamping tool and releasing the stamping tool from the encapsulation material.

3. The method of claim 2, wherein shaping comprises forming a lens profile in front of each of the LEDs.

4. The method of claim 3, wherein the lens profiles of some of the LEDs are different from the lens profiles of the others of the LEDs.

5. The method of claim 3, wherein the lens profiles are shaped to concentrate light from the LEDs in a front direction.

6. The method of claim 1, further comprising dicing the substrate to form individual encapsulated LEDs.

7. The method of claim 1, further comprising dicing the substrate to form a smaller array of multiple encapsulated LEDs.

8. The method of claim 1, wherein integrating the LEDs with the molded mirror reflector array comprises surrounding each of the plurality of LEDs with a micro-mirror reflector of the molded mirror reflector array.

9. The method of claim 8, further comprising forming the molded mirror reflector array by stamping a molding material with a stamping tool and curing the molding material prior to integrating the LEDs with the molded mirror reflector array.

10. The method of claim 9, further comprising metalizing the molded mirror reflector array.

11. The method of claim 1, wherein the encapsulation material comprises one of PMMA, cyclo olefin polymer resin, composite filled ceramic polymer, and composite ceramic polymers.

12. The method of claim 1, further comprising fabricating the plurality of LEDs and singulating the LEDs prior to mounting the LEDs on the packaging substrate.

13. The method of claim 1, wherein the packaging substrate comprises one or more of Si, BeO, AlN, a thermally conductive ceramic, or a thermally conductive polymer filled with micro particles for thermal properties.

14. The method of claim 1, further comprising:
forming the packaging substrate by stamping a molding material with a stamping tool and curing the molding material prior to mounting the plurality of LEDs on the packaging substrate.

15. The method of claim 14, wherein forming the packaging substrate comprises forming back-side vias in the packaging substrate.

16. The method of claim 14, further comprising plating or sputtering the packaging substrate with reflective metal and patterning the metal.

17. The method of claim 1, further comprising plating or sputtering the packaging substrate with metal and patterning the metal.

18. A method of forming an array of LED dies on a packaging substrate, the method comprising:
providing the packaging substrate, wherein the packaging substrate is formed from a material selected from the group consisting of one or more of Si, BeO, AlN, a thermally conductive ceramic and a thermally conductive polymer filled with micro particles for thermal properties, and the packaging substrate comprises an array of patterned metal contacts on a front side, the metal contacts being electrically connected to leads formed on one of a front side and a back side of the packaging substrate;

mounting a plurality of pre-fabricated and singulated LED dies on the packaging substrate, disposing an encapsulation material onto the LED dies to encapsulate the LED dies on the packaging substrate;

shaping the encapsulation material to simultaneously form a plurality of shaped lens profiles in front of the LED dies, wherein shaping comprises stamping the encapsulation material with a patterned stamping tool; and electrically connecting the LED dies with the metal contacts.

19. The method of claim 18, further comprising:
forming the packaging substrate by stamping a molding material with a stamping tool and curing the molding material prior to mounting the plurality of LEDs on the packaging substrate.

20. The method of claim 19, wherein forming the packaging substrate includes forming wells and coating surfaces of the wells with a reflective coating, wherein mounting the LED dies comprises placing the LED dies within the wells.

21. The method of claim 20, wherein the wells have curved sidewall surfaces.

22. The method of claim 18, wherein a pitch of the LED dies on the packaging substrate is between about 100 µm and 1 mm.

23. The method of claim 18, wherein disposing the encapsulation material comprising lens profiles comprises dispensing the encapsulation material onto the array of LED dies and curing the encapsulation material to form encapsulations in front of the LED dies.

24. The method of claim 23, wherein a single encapsulation is formed in front of more than one of the LED dies.

25. A method of wafer-level packaging including forming an array of LED dies on a packaging substrate, the method comprising:
providing the packaging substrate as part of a wafer, wherein the packaging substrate comprises an array of patterned metal contacts on a front side, the metal contacts being in electrical communication with control logic formed in the wafer;

mounting a plurality of pre-fabricated and singulated LED dies on the wafer, disposing an encapsulation material onto the LED dies to encapsulate the LED dies on the wafer;

shaping the encapsulation material to simultaneously form a plurality of shaped lens profiles in front of the LED dies; and electrically connecting the LED dies with the metal contacts, wherein electrically connecting comprises connecting with a conductive bonding material.

26. The method of claim 25, wherein the conductive bonding material comprises one of solder and/or conductive epoxy.

27. A method of wafer-level packaging including forming an array of LED dies on a packaging substrate, the method comprising:
- providing the packaging substrate as part of a wafer, wherein the packaging substrate comprises an array of patterned metal contacts on a front side, the metal contacts being in electrical communication with control logic formed in the wafer;
- mounting a plurality of pre-fabricated and singulated LED dies on the wafer;
- disposing an encapsulation material onto the LED dies to encapsulate the LED dies on the wafer;
- shaping the encapsulation material to simultaneously form a plurality of shaped lens profiles in front of the LED dies; and
- electrically connecting the LED dies with the metal contacts, wherein electrically contacting comprises wirebonding.

* * * * *